(12) United States Patent
Kataoka

(10) Patent No.: US 7,843,711 B2
(45) Date of Patent: Nov. 30, 2010

(54) SWITCHING TRANSISTOR DRIVER CIRCUIT CONTROLLING POWER SUPPLY TO THE LOAD

(75) Inventor: Shinichiro Kataoka, Osaka (JP)

(73) Assignee: Panasonic Corporation, Osaka (JP)

( * ) Notice: Subject to any disclaimer, the term of this patent is extended or adjusted under 35 U.S.C. 154(b) by 377 days.

(21) Appl. No.: 11/704,357

(22) Filed: Feb. 9, 2007

(65) Prior Publication Data

US 2007/0210780 A1   Sep. 13, 2007

(30) Foreign Application Priority Data

Mar. 6, 2006   (JP) .............................. 2006-058799

(51) Int. Cl.
*H02H 7/122* (2006.01)
*H02M 7/5387* (2007.01)

(52) U.S. Cl. .................. 363/56.04; 363/56.05; 363/132

(58) Field of Classification Search ................ 323/272, 323/282; 363/55, 56.01, 56.02, 56.04, 56.05, 363/131, 132
See application file for complete search history.

(56) References Cited

U.S. PATENT DOCUMENTS

| | | | | |
|---|---|---|---|---|
| 4,633,381 A | * | 12/1986 | Upadhyay | ................ 363/56.04 |
| 5,930,132 A | * | 7/1999 | Watanabe et al. | ......... 363/56.04 |
| 6,943,533 B2 | * | 9/2005 | Okuno | ........................ 323/222 |
| 7,236,020 B1 | * | 6/2007 | Virgil | .......................... 327/108 |
| 7,436,160 B2 | * | 10/2008 | Rusu et al. | ................... 323/284 |
| 7,446,513 B2 | * | 11/2008 | Dikken et al. | ................ 323/271 |
| 2004/0130923 A1 | * | 7/2004 | Yin Ho et al. | ................ 363/131 |

FOREIGN PATENT DOCUMENTS

| | | | |
|---|---|---|---|
| GB | 2244400 A | * | 11/1991 |
| JP | 4-230117 | | 8/1992 |
| JP | 8-65143 | | 3/1996 |
| JP | 2001-16870 | | 1/2001 |

* cited by examiner

*Primary Examiner*—Jeffrey L Sterrett
*Assistant Examiner*—Fred E Finch, III
(74) *Attorney, Agent, or Firm*—Steptoe & Johnson LLP

(57) ABSTRACT

Of a pair of switching transistors connected in series between a high voltage power source and the ground, when the switching transistor on the high potential side is controlled by an RS flip-flop in response to an input signal, in order to prevent a malfunction caused by the influence of dv/dt transient phenomena of an output terminal for driving a load, a latch circuit is reset using an input signal from a low side input terminal LIN in a period during which the voltage of the output terminal for driving the load abruptly decreases.

10 Claims, 22 Drawing Sheets

# SWITCHING TRANSISTOR DRIVER CIRCUIT CONTROLLING POWER SUPPLY TO THE LOAD

FIELD OF THE INVENTION

The present invention relates to a switching transistor driver circuit for controlling a pair of switching transistors connected in series such that power supply to a load is controlled based on a pulse signal fed to a high side input terminal and a low side input terminal.

BACKGROUND OF THE INVENTION

This kind of switching transistor driver circuit is disclosed in Japanese Patent Laid-Open No. 4-230117. The circuit is configured as shown in FIG. 15.

In this configuration, when a load 230 is driven by a high voltage power supply 228, voltage is applied from the high voltage power supply 228 to a series circuit of a pair of power N-channel MOS transistors (hereinafter, will be referred to as transistors) 224 and 225, and the load 230 is connected to a junction point of the source of the transistor 224 and the drain of the transistor 225. Of the transistors 224 and 225, the transistor 224 on the high potential side is turned on/off by a pulse signal having a different reference potential from a low voltage circuit. Reference numeral 229 denotes a low voltage power supply.

Thus a rising edge serving as a leading edge of a pulse signal inputted for driving the transistor 224 on the high potential side and a falling edge serving as a trailing edge of the pulse signal are detected, the reference potential of each edge detection pulse is level shifted, and then an RS flip-flop 222 is set/reset by each edge detection pulse, so that a pulse equivalent to the inputted pulse is generated according to the reference potential of the transistor 224 to control the on/off of the transistor 224.

In this configuration, the driver circuit of the transistors 224 and 225 is constructed in a semiconductor integrated circuit 200. In the semiconductor integrated circuit 200, reference character VS denotes a lower reference potential input terminal of the transistor 224, reference character VB denotes an upper reference potential input terminal of the circuit for driving the transistor 224, reference characters VDD and VCC denote power supply input terminals, reference characters VSS and COM denote ground terminals, reference character HO denotes a high side output terminal fed with the gate signal of the transistor 224. Reference character LO denotes a low side output terminal fed with the gate signal of the transistor 225. Reference character HIN denotes a high side input terminal and reference character LIN denotes a low side input terminal. Output pulse signals are outputted from the high side output terminal HO and the low side output terminal LO in response to the input pulse signals from the high side input terminal HIN and the low side input terminal LIN to control the on/off of the transistors 224 and 225.

In logic where the transistors 224 and 225 are simultaneously turned on and through current does not pass between the high voltage power supply 228 and the ground, the input pulse signals are inputted from the high side input terminal HIN and the low side input terminal LIN. Upon switching of input logic from the high side input terminal HIN and the low side input terminal LIN, a period called a dead time is set in which the high side input terminal HIN and the low side input terminal LIN are both inevitably set at "L" level and the high side output terminal HO and the low side output terminal LO are both set at "L" level.

The input pulse signals of the high side input terminal HIN, the low side input terminal LIN, and an input terminal SD are configured such that when the input terminal SD is set at "H" level, the outputs of latches 204 and 205 are set at "H" level, the outputs of NOR gates 206 and 207 are set at "L" level, the high side output terminal HO and the low side output terminal LO are set at "L" level, and no signals are transmitted from the high side input terminal HIN and the low side input terminal LIN to the high side output terminal HO and the low side output terminal LO. When inputting "H" level to the input terminal SD upon initialization or the like, the latches 204 and 205 are initialized and the high side output terminal HO and the low side output terminal LO are set at "L" level. When performing a normal operation, "L" level is inputted to the input terminal SD, so that pulse signals from the high side input terminal HIN and the low side input terminal LIN are respectively outputted from the NOR gates 206 and 207. In VDD/VCC level shifts 208 and 209, a pulse signal using VDD as a power supply voltage reference is transformed to a pulse signal using VCC as a power supply voltage reference.

The signal from the VDD/VCC level shift 209 is transmitted to the gates of output N-channel MOS transistors 212 and 213 via a delay circuit 210 for matching a delay time from the low side input terminal LIN to the low side output terminal LO with a delay time from the high side input terminal HIN to the high side output terminal HO, and the transistor 225 is driven by the signal from the low side output terminal LO. When a VCC power supply voltage is lower than a predetermined voltage in an undervoltage detection circuit 231, the circuit may not normally operate. Thus the undervoltage detection circuit 231 is configured such that the signal from the low side input terminal LIN is not transmitted to the gates of the output N-channel MOS transistors 212 and 213 and the signal from the high side-input terminal HIN is not transmitted to the gates of transistors 220 and 221.

The signal from the VDD/VCC level shift 208 is transformed, in a pulse oscillator 214, into two thin pulses in which the leading edge and the trailing edge of an input waveform are detected. The two pulses are respectively inputted to the gates of high breakdown voltage transistors 215 and 216 for level shift and the voltage levels of the pulses are changed. Thereafter, the pulses pass through a pulse filter 219 and are inputted to the set input terminal and the reset input terminal of the RS flip-flop 222. The input pulse signal from the high side input terminal HIN is outputted to the high side output terminal HO while the voltage level of the signal is changed (in reality, there is a slight time lag), so that the transistor 224 is driven.

The voltage of the low voltage power supply 229 is always inputted to the VCC terminal. When the low side output terminal LO is set at "H" level and the high side output terminal HO is set at "L" level, a voltage obtained by subtracting the diode voltage of a diode 227 from the voltage of the low voltage power supply 229 is applied to the upper reference potential input terminal VB. When the low side output terminal LO is set at "L" level and the high side output terminal HO is set at "H" level, a voltage close to the voltage of the high voltage power supply 228 is applied to the lower reference potential input terminal VS. The voltage of the upper reference potential input terminal VB increases in parallel with the voltage of the lower reference potential input terminal VS while keeping, in a capacitor 226, the voltage obtained by subtracting the diode voltage of the diode 227 from the voltage of the low voltage power supply 229.

In a mode where a potential difference between the upper reference potential input terminal VB and the lower reference potential input terminal VS is lower than a predetermined voltage in an undervoltage detection circuit 223, the circuit may not normally operate. Thus the signal from the high side input terminal HIN is not transmitted to the gates of the transistors 220 and 221.

FIG. 16 shows a specific structural example of the pulse oscillator 214 serving as a constituent element of FIG. 15. The circuit operations will be described below with reference to the timing chart of FIG. 17.

Reference numerals 141, 143, 144, 145, 146, 147, 148, 149, 150 and 151 denote inverters, reference numerals 142 and 152 denote NOR gates, reference numerals 153, 154, 155 and 156 denote capacitors, reference numerals 157, 158, 159, 160 and 161 denote signal lines, reference numeral 157 denotes an input signal from the VDD/VCC level shift 208 of FIG. 15, reference numeral 159 denotes an output signal to the gate of the transistor 215, and reference numeral 161 denotes an output signal to the gate of the transistor 216.

In FIG. 17, (t153+t154) represents an amount of delay caused by the capacitors 153 and 154 of FIG. 16 and (t115+t156) represents an amount of delay caused by the capacitors 155 and 156 of FIG. 16.

The signal level-shifted by the VDD/VCC level shift 208 is inputted from the high side input terminal HIN to the signal line 157 serving as the input of the pulse oscillator 214, a signal obtained by delaying the signal of the signal line 157 is outputted to the output (the signal line 158) of the inverter 146, and a signal obtained by delaying and inverting the signal of the signal line 157 is outputted to the output (the signal line 160) of the inverter 151. Thus the thin pulse where the leading edge of the signal of the signal line 157 has been detected is outputted to the output (the signal line 159) of the NOR gate 142, the thin pulse where the trailing edge of the signal of the signal line 157 has been detected is outputted to the output (the signal line 161) of the NOR gate 152, the signal of the output (the signal line 159) of the NOR gate 142 is inputted to the inverted set input terminal of the RS flip-flop 222 via the high-voltage level shift circuit and the pulse filter 219 of FIG. 15, and the signal of the output (the signal line 161) of the NOR gate 152 is inputted to the inverted reset input terminal of the RS flip-flop 222 via the high voltage level shift circuit and the pulse filter 219.

The two set and reset pulse filters 219 are provided as constituent elements of FIG. 15. FIG. 18 shows a specific configuration example showing one of the two pulse filters 219. The circuit operations will be described below with reference to the timing chart of FIG. 19.

Reference numeral 215 denotes a high breakdown voltage transistor for level shift, reference numerals 217 and 241 denote resistors, reference numeral 244 denotes a ballast resistor, reference numeral 243 denotes a parasitic capacitance present on diffusion as a semiconductor between the drain and ground terminal of the transistor 215, reference numerals 233, 234, 235 and 236 denote P-channel MOS transistors, reference numerals 237, 238, 239 and 240 denote N-channel MOS transistors, and reference numeral 242 denotes a capacitor.

Waveform A in FIG. 19 corresponds to the waveform of the output (the signal line 159) of the NOR gate 142 shown in FIG. 16. Waveform B is rounded by the influence of the resistor 217 and the capacitor 243, waveform C is slightly made angular, and waveform D is further sharpened. In waveform E, charging to the capacitor 242 through the resistor 241 is made longer and thus the rising time is delayed. Waveform F is made angular, has a leading edge delayed from the leading edge of the waveform A, and has a pulse width shorter than that of the waveform A. However, the pulse is normally inputted to the inverted set input terminal of the RS flip-flop 222.

The pulse filter 219 of FIG. 15 has the following effect: even when noise is inputted to the previous stage of the pulse filter 219 due to dv/dt transient phenomena or the like, the noise is removed in the waveform F by filter effect as indicated by the dotted line waveforms of FIG. 19. Thus the noise is not inputted to the RS flip-flop 222.

As described above, in the conventional switching transistor driver circuit, the pulse filter 219 (specifically shown in FIG. 18) is disposed between the high voltage level shift circuit and the RS flip-flop 222, and thus even when noise having a short pulse width occurs in the previous stage of the RS flip-flop 222 due to dv/dt transient phenomena or the like, the noise is not inputted to the RS flip-flop 222. Thus no malfunctions occur.

DISCLOSURE OF THE INVENTION

However, the conventional switching transistor driver circuit has the following problems:

The upper reference potential input terminal VB in the high voltage level shift circuit of FIG. 15 has a high voltage when the transistor 224 is turned on. Thus in order to prevent large power consumption when the high breakdown voltage transistors 215 and 216 for level shift are turned on, it is necessary to minimize the pulse widths of the signal (set signal) of the signal line 159 and the signal (reset signal) of the signal line 161 in FIG. 17. The signal lines serve as the gate inputs of the transistors 215 and 216.

However, since the pulse filter 219 of FIG. 15 is present between the high-voltage level shift circuit and the RS flip-flop 222, the set signal and reset signal of FIG. 17 may be eliminated by the pulse filter 219, though the signals should be inputted to the RS flip-flop 222.

For example, in the case where a constant is set in the pulse filter 219 so as to remove noise having a 50-ns width, the set signal and the reset signal which are outputted from the pulse oscillator 214 and shown in FIG. 17 are not inputted to the RS flip-flop 222 when the pulse widths of the signals are not larger than 50 ns.

When the time constant of the pulse filter 219 is reduced and short pulse widths are set for the set signal and the reset signal from the pulse oscillator 214, noise with a large pulse width cannot be removed by the pulse filter 219 and thus the RS flip-flop 222 malfunctions. When the RS flip-flop 222 malfunctions such that the transistor 225 is turned on and the transistor 224 is also turned on, a large through current passes between the high-voltage power supply and the ground through the transistors 224 and 225, so that the transistors 224 and 225 may be broken.

In this way, a problem of a trade-off relationship arises between the setting of power consumption in the high-voltage level shift circuit and the setting of the time constant of the pulse filter 219 for setting the noise removal level.

An object of the present invention is to provide a switching transistor driver circuit which allows an RS flip-flop to positively operate without being affected by transient phenomena and eliminates the need for a filter circuit having a time constant.

A switching transistor driver circuit according to the present invention includes a series junction between a high-side switching transistor on the high potential side and a low-side switching transistor on the low potential side is an output terminal, the high-side switching transistor is switched based on the control pulse signal of the output of a high side circuit, and the low-side switching transistor is switched based on the control pulse signal of the output of a low side circuit, so that power supply to the output terminal is controlled, wherein the low side circuit is switched based on a second input pulse signal fed to a low side input terminal and generates the control pulse signal for turning on/off the low side switching transistor, and the high side circuit is configured such that a latch circuit is set/reset by each edge detection pulse having the detected leading edge and trailing edge of a first input pulse signal fed to a high side input terminal, the control pulse signal for turning on/off the high-side switching transistor is generated, and the latch circuit is reset in a period during which the terminal voltage of the output terminal is inverted or in a period immediately after the inversion.

A switching transistor driver circuit of the present invention, described above, wherein the latch circuit is reset when the low-side switching transistor is turned on after the high-side switching transistor is turned off or in a period during which current passes through the output terminal from the low-side switching transistor after the high-side switching transistor is turned off.

A switching transistor driver circuit according to the present invention, described aobve, may also be one wherein the low side circuit includes a delay circuit which is disposed on a path from the low side input terminal to the low-side switching transistor to make a correction of a signal delay time in the high side circuit and contributes to formation of the control pulse signal for turning on/off the low-side switching transistor, a reset pulse generation circuit for preventing a malfunction, the reset pulse generation circuit delaying the second input pulse signal fed from the low side input terminal and generating a reset signal for the high side circuit, the high side circuit includes a first edge detection circuit for detecting the leading edge of the first input pulse signal and a second edge detection circuit for detecting the trailing edge of the first input pulse signal, the latch circuit has a set input and a reset input respectively fed with signals obtained by changing, in a level shift circuit, the voltage level of an edge signal outputted from the first edge detection circuit and the voltage level of an edge signal outputted from the second edge detection circuit, the reset input being also fed with a signal obtained by changing, in the level shift circuit, the voltage level of the output signal from the reset pulse generation circuit, the latch circuit has a minimum reference potential terminal connected to the low potential side of the high-side switching transistor, and the high-side switching transistor is driven based on an output signal from the latch circuit.

A switching transistor driver circuit according to the present invention, described above, wherein the level shift circuit changes the voltage level of the output signal from the reset pulse generation circuit and the voltage levels of the first and second edge signals outputted from the first and second edge detection circuits.

A switching transistor driver circuit according to the present invention, described aobve, may also be one wherein the reset pulse generation circuit generates a reset signal for the latch circuit in synchronization with the leading edge or the trailing edge of the second input pulse signal in a period during which the terminal voltage of the output terminal is inverted or in a period immediately after the inversion.

A switching transistor driver circuit according to the present invention, described aobve, may also be one wherein the reset pulse generation circuit is fed with the output signal of a first delay circuit as an input signal, the delay circuit is made up of the first delay circuit fed with the second input pulse signal as an input signal and a second delay circuit fed with the output signal of the first delay circuit as an input signal, and the low-side switching transistor is driven based on the output signal of the second delay circuit.

A switching transistor driver circuit according to the present invention, described aobve, may also be one wherein the delay circuit is made up of first and second delay circuits, each being fed with the second input pulse signal as an input signal, the reset pulse generation circuit is fed with the output signal of the first delay circuit having a shorter delay time than the second delay circuit, and the low-side switching transistor is driven based on the output signal of the second delay circuit.

A switching transistor driver circuit according to the present invention, described above, may further include a delay circuit between the inputs of the first and second edge detection circuits and the high side input terminal.

A switching transistor driver circuit according to the present invention, described above, may also be one wherein in a period during which the terminal voltage of the output terminal is inverted or in a period immediately after the inversion, a generator of a reset signal inputted to the latch circuit sets the timing of start of reset in response to the signal from the second edge detection circuit for switching the high-side switching transistor from on to off, the reset is completed in synchronization with the leading edge or the trailing edge of the second input pulse signal, a reset pulse width serving as a reset period is set by the output signal of the reset pulse generation circuit, and a continuous reset pulse signal is generated by delaying the rear edge of the output signal of the second edge detection circuit for detecting the trailing edge of the first input pulse signal or advancing the front edge of the reset pulse signal of the output of the reset pulse generation circuit.

A switching transistor driver circuit according to the present invention, described above, may also include a delay circuit constructed on a path from the low side input terminal to the low-side switching transistor, a reset pulse generation circuit for preventing a malfunction, the reset pulse generation circuit being fed with an input signal from the delay circuit, and a first edge detection circuit for detecting the leading edge of the first input pulse signal, wherein the latch circuit has a set input fed with a signal obtained by changing, in a level shift circuit, the voltage level of an edge signal outputted from the first edge detection circuit and a reset input fed with a signal obtained by changing, in the level shift circuit, the voltage level of an output signal from the reset pulse generation circuit, the latch circuit has a minimum reference potential terminal connected to the low potential side of the high-side switching transistor, and the high-side switching transistor is driven based on an output signal from the latch circuit.

A switching transistor driver circuit according to the present invention, described above, may also be one wherein the reset pulse generation circuit generates a reset signal for the latch circuit in synchronization with the leading edge or the trailing edge of the second input pulse signal in a period during which the terminal voltage of the output terminal is inverted or in a period immediately after the inversion.

A switching transistor driver circuit according to the present invention, described above, may also be one wherein the reset pulse generation circuit is fed with the output signal of a first delay circuit as an input signal, the delay circuit is made up of the first delay circuit fed with the second input pulse signal as an input signal and a second delay circuit fed with the output signal of the first delay circuit as an input signal, and the low-side switching transistor is driven based on the output signal of the second delay circuit.

A switching transistor driver circuit according to the present invention, described above, may also be one wherein the delay circuit is made up of first and second delay circuits, each being fed with the second input pulse signal as an input signal, the reset pulse generation circuit is fed with the output signal of the first delay circuit having a shorter delay time than the second delay circuit, and the low-side switching transistor is driven based on the output signal of the second delay circuit.

A switching transistor driver circuit according to the present invention, described above, may include a first delay circuit constructed on a path from the low side input terminal to the low-side switching transistor, a first edge detection circuit for detecting the leading edge of the pulse signal fed to the high side input terminal, and a second edge detection circuit for detecting the trailing edge of the pulse signal fed to the high side input terminal, wherein the latch circuit has a minimum reference potential terminal connected to the low potential side of the high-side switching transistor, the latch circuit has a set input and a reset input respectively fed with signals obtained by changing, in a level shift circuit, the voltage level of an edge signal outputted from the first edge detection circuit and the voltage level of an edge signal outputted from the second edge detection circuit, the high-side switching transistor is driven based on the output signal of the latch circuit, and the signal from the second edge detection circuit is inputted as a reset signal to the latch circuit by delaying the signal from the second edge detection circuit or delaying the rear edge of the signal from the second edge detection circuit, the rear edge indicating the timing of end of reset, in a period during which the terminal voltage of the output terminal is inverted or in a period immediately after the inversion.

A switching transistor driver circuit according to the present invention includes a series junction between a high-side switching transistor on the high potential side and a low-side switching transistor on the low potential side is an output terminal, the high-side switching transistor is switched based on the control pulse signal of the output of a high side circuit, and the low-side switching transistor is switched based on the control pulse signal of the output of a low side circuit, so that power supply to the output terminal is controlled, the switching transistor driver circuit including a first delay circuit constructed on a path from a low side input terminal to the low-side switching transistor, a first edge detection circuit for detecting the leading edge of a pulse signal fed to a high side input terminal, and a second edge detection circuit for detecting the trailing edge of the pulse signal fed to the high side input terminal, wherein the latch circuit has a minimum reference potential terminal connected to the low potential side of the high-side switching transistor, the latch circuit has a set input and a reset input respectively fed with signals obtained by changing, in a level shift circuit, the voltage level of an edge signal outputted from the first edge detection circuit and the voltage level of an edge signal outputted from the second edge detection circuit, the high-side switching transistor is driven based on the output signal of the latch circuit, and in a period during which the high-side switching transistor is turned off by the pulse signal fed to the high side input terminal, the set input to the latch circuit is prohibited on the input side of the level shift circuit by using a first period during which a signal for turning on the low-side switching transistor is inputted from the low side input terminal or a second period obtained by delaying the first period.

A switching transistor driver circuit according to the present invention includes a series junction between a high-side switching transistor on the high potential side and a low-side switching transistor on the low potential side is an output terminal, the high-side switching transistor is switched based on the control pulse signal of the output of a high side circuit, and the low-side switching transistor is switched based on the control pulse signal of the output of a low side circuit, so that power supply to the output terminal is controlled, the switching transistor driver circuit including a first delay circuit disposed on a path from the low side input terminal to the low-side switching transistor, a first edge detection circuit for detecting the leading edge of a pulse signal fed to the high side input terminal, and a second edge detection circuit for detecting the trailing edge of the pulse signal fed to the high side input terminal, wherein the latch circuit has a minimum reference potential terminal connected to the low potential side of the high-side switching transistor, the latch circuit has a set input and a reset input respectively fed with signals obtained by changing, in a level shift circuit, the voltage level of an edge signal outputted from the first edge detection circuit and the voltage level of an edge signal outputted from the second edge detection circuit, the high-side switching transistor is driven based on the output signal of the latch circuit, and in a period during which the low-side switching transistor is turned off by a pulse signal fed to the low side input terminal, an on signal to the low-side switching transistor is prohibited on an input path from the output of the first delay circuit to the low-side switching transistor by using a third period during which the pulse signal fed from the high side input terminal is inputted to turn on the high-side switching transistor or a fourth period obtained by delaying the third period.

With this configuration, when the latch circuit may malfunction due to the influence of dv/dt transient phenomena, the voltage of the output terminal for driving a load switches from high (high voltage) to "L" level (low voltage) or switches from "L" level (low voltage) to "H" level (high voltage). In other words, of the high-side switching transistor on the high potential side and the low-side switching transistor on the low potential side that are connected in series, the high-side switching transistor switches from on to off and the low-side switching transistor switches from off to on, or the low-side switching transistor switches from on to off and the high-side switching transistor switches from off to on. When the high-side switching transistor switches from on to off and the low-side switching transistor switches from off to on, even in the event of noise inputted to the latch circuit, the latch circuit is reset and thus the latch circuit does not malfunction to come into a set state such that through current passes through the series circuit of the high-side switching transistor and the low-side switching transistor and the transistors are broken. Regarding a problem of a trade-off relationship between the setting of power consumption in the high-voltage level shift circuit and the setting of the time constant of the pulse filter for setting the noise removal level in the conventional switching transistor driver circuit, noise is reduced by resetting the latch circuit in a period during which noise occurs, so that it is possible to eliminate the need for the pulse filter or reduce the time constant of the pulse filter. Therefore, the problem of the conventional switching transistor driver circuit is solved.

Further, the output terminal is the series junction between the high-side switching transistor on the high potential side and the low-side switching transistor on the low potential side. Even in a period other than the time when the voltage of the output terminal for driving the load switches from "H" level (high voltage) to "L" level (low voltage), in a period during which the high-side switching transistor is turned off by the first input pulse signal from the high side input terminal, the set input to the latch circuit is prohibited in the previous stage of the input of the level shift circuit by using the first period during which the second input pulse signal for turning on the low-side switching transistor is inputted from the low side input terminal or the second period obtained by delaying the first period. It is thus possible to eliminate the need for the pulse filter or reduce the time constant of the pulse filter.

When the low-side switching transistor switches from on to off and the high-side switching transistor switches from off to on, even in the case where a malfunction of the latch circuit turns off the high-side switching transistor to be turned on, through current does not pass through the series circuit of the high-side switching transistor and the low-side switching transistor. Thus the switching transistors are not broken. Normal circuit operations can be continued by inputting the first and second input pulse signals of the subsequent period to the high side input terminal and the low side input terminal.

Moreover, since the driver circuit of the low-side switching transistor does not have a latch circuit, even when noise turning on the low-side switching transistor for a moment is inputted, there is little possibility of a break of a pair of switching transistors which are the high-side switching transistor and low-side switching transistor connected in series. In a period during which the low-side switching transistor is turned off by the low side input pulse signal from the low side input terminal, the on signal to the low-side switching transistor is prohibited by using the third period during which the pulse signal fed from the high side input terminal turns on the high-side switching transistor of the pair of switching transistors or using the fourth period obtained by delaying the third period, on the input path from the output of the delay circuit to the low-side switching transistor. Thus through current caused by noise does not pass through the pair of switching transistors connected in series, so that the pair of switching transistors is not broken.

In the foregoing explanation, the output terminal is the series junction of the high-side switching transistor and the low-side switching transistor, a malfunction caused by noise to the set input of the latch circuit is prevented in the latch circuit when a voltage on the point for driving the load switches from "H" level (high voltage) to "L" level (low voltage), so that a break of the pair of switching transistors can be prevented. When the voltage of the output terminal switches from "H" level to "L" level, the voltage of the output terminal, the voltage of the terminal for driving the load, the voltage of the upper reference potential terminal serving as the current supply source of the latch circuit, and the voltage of the driving terminal of the high-side switching transistor greatly change in an abrupt manner. The latch circuit including a semiconductor integrated circuit may malfunction due to the influence of parasitism or the like when these voltages become negative potentials for a moment, or the latch circuit may malfunction when the potential relationship between circuit points becomes abnormal in a transitional manner. Although the pulse filter for removing noise is provided in the previous stage of the latch circuit, a malfunction directly occurring in the latch circuit cannot be avoided, it is possible to prevent a malfunction by resetting the latch circuit when the voltage of the output terminal switches from "H" level to "L" level.

Particularly in the case where the load connected to the output terminal includes a coil, in a dead time period during which the low-side switching transistor and the high-side switching transistor are both turned off immediately after the high-side switching transistor switches from on to off in a state in which the low-side switching transistor is turned off, the terminal voltage of the output terminal for driving the load has a negative potential reduced from the ground terminal voltage by a diode voltage when the low-side switching transistor is an N-channel MOS transistor and a parasitic diode has a source serving as an anode and a drain serving as a cathode, so that the latch circuit including the semiconductor integrated circuit may malfunction due to a parasitic operation. Such a malfunction can be avoided by resetting the latch circuit in a period during which the terminal voltage of the output terminal decreases.

DESCRIPTION OF THE EMBODIMENTS

Referring to FIGS. 1 to 14, embodiments of the present invention will now be described below.

Embodiment 1

The following will describe a switching transistor driver circuit according to Embodiment 1 of the present invention.

Figure 1:
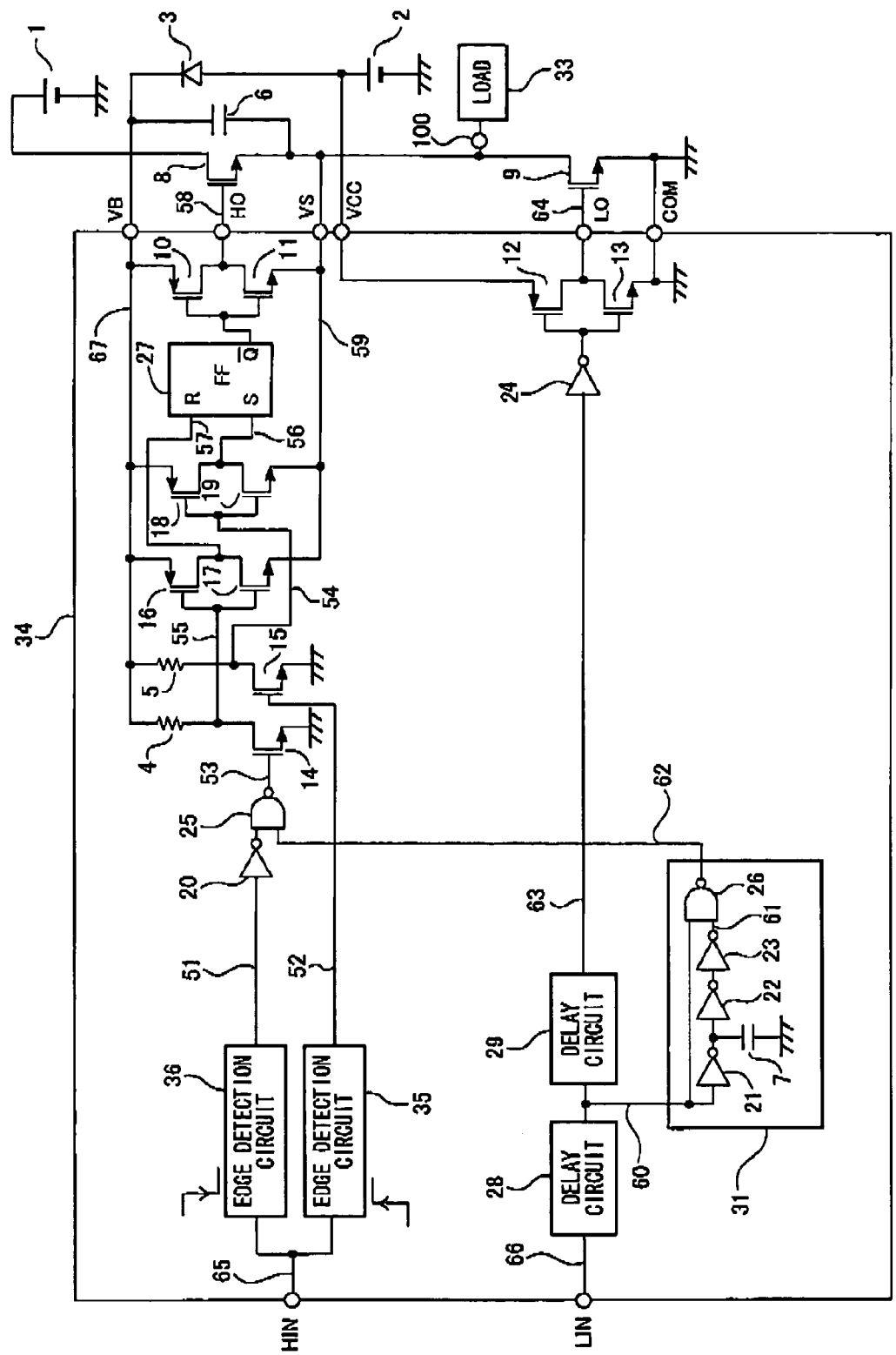
FIG. 1 shows a switching transistor driver circuit according to Embodiment 1 of the present invention.

FIG. 1 shows the switching transistor driver circuit of the present invention. Reference numeral 1 denotes a high voltage power supply, reference numeral 2 denotes a low voltage power supply, reference numeral 3 denotes a diode, reference numerals 4 and 5 denote resistors, reference numeral 6 and 7 denote capacitors, and reference numerals 8 and 9 denote power N-channel MOS transistors (hereinafter, will be referred to as transistors) serving as a pair of switching transistors connected in series. In this configuration, the transistor 8 on the high potential side is a high-side switching transistor and the transistor 9 on the low potential side is a low-side switching transistor. Reference numerals 10 and 12 denote output P-channel MOS transistors (hereinafter, will be referred to as transistors), reference numerals 11 and 13 denote output N-channel MOS transistors (hereinafter, will be referred to as transistors), reference numerals 14 and 15 denote high breakdown voltage N-channel MOS transistors for level shift (hereinafter, will be referred to as transistors), the transistors making up a high voltage level shift circuit, reference numerals 16 and 18 denote P-channel MOS transistors (hereinafter, will be referred to as transistors), reference numerals 17 and 19 denote N-channel MOS transistors (hereinafter, will be referred to as transistors), reference numerals 20, 21, 22, 23 and 24 denote inverters, reference numerals 25 and 26 denote NAND gates, reference numeral 27 denotes an RS flip-flop serving as a latch circuit, reference numerals 28 and 29 denote delay circuits, reference numeral 31 denotes a reset pulse generation circuit for preventing a malfunction, reference numeral 35 denotes an edge detection circuit for detecting a rising edge serving as a leading edge, and reference numeral 36 denotes an edge detection circuit for detecting a falling edge serving as a trailing edge. The main part of the switching transistor driver circuit is integrated in a semiconductor integrated circuit 34. A load 33 is connected to an output terminal 100 on the series junction of the transistors 8 and 9 in series.

Reference numerals 51, 52, 53, 54, 55, 56, 57, 58, 59, 60, 61, 62, 63, 64, 65, 66 and 67 denote signal lines, reference character VCC denotes a power supply input terminal, reference character HIN denotes a high side input terminal, reference character LIN denotes a low side input terminal, reference character COM denotes a ground terminal, reference character VS denote a lower reference potential input terminal (hereinafter, will be referred to as a VS terminal) of a circuit for driving the transistor 8, reference character VB denotes an upper reference potential input terminal (hereinafter, will be referred to as a VB terminal) of the circuit for driving the transistor 8, reference character HO denotes a high side output terminal, and reference character LO denotes a low side output terminal.

Output pulse signals are outputted from the high side output terminal HO and the low side output terminal LO in response to input pulse signals from the high side input terminal HIN and the low side input terminal LIN and the on/off of the transistors 8 and 9 is controlled. In logic where the transistors 8 and 9 are simultaneously turned on and a through current does not pass between the high voltage power supply 1 and the ground, the input pulse signals are inputted from the high side input terminal HIN and the low side input terminal LIN. When the logic of input from the high side input terminal HIN and the low side input terminal LIN is switched in response to the through current, a period called a dead time is set in which the high side input terminal HIN and the low side input terminal LIN are both inevitably set at "L" level (the high side output terminal HO and the low side output terminal LO are both set at "L" level).

The signal of the signal line 66 from the low side input terminal LIN is inputted to the gates of the transistors 12 and 13 having high driving capabilities via the delay circuits 28 and 29 for matching a delay time from the low side input terminal LIN to the low side output terminal LO with a delay time from the high side input terminal HIN to the high side output terminal HO, and the drains of the transistors 12 and 13 drive the gate of the transistor 9 to control the on/off of the transistor 9.

The signal of the signal line 65 from the high side input terminal HIN is inputted to the edge detection circuit 35 serving as a first edge detection circuit and the edge detection circuit 36 serving as a second edge detection circuit. A signal having the detected leading edge of the signal of the signal line 65 is outputted to the signal line 52 and a signal having the detected trailing edge of the signal of the signal line 65 is outputted to the signal line 51. Through a high voltage level shift circuit made up of the resistor 5 and the transistor 15, the signal of the signal line 52 is transformed into a signal having the voltage level of the circuit having a VS terminal voltage as the lower reference voltage and a VB terminal voltage as the upper reference voltage. After passing through an inverter made up of the transistors 18 and 19, the signal is inputted to the set terminal of the RS flip-flop 27. After passing though the inverter 20 and the logic of the NAND gate 25, through a high voltage level shift circuit made up of the resistor 4 and the transistor 14, the signal of the signal line 51 is similarly transformed into a signal having the voltage level having the VS terminal voltage as the lower reference voltage and the VB terminal voltage as the upper reference voltage. After passing through an inverter made up of the transistors 16 and 17, the signal is inputted to the reset terminal of the RS flip-flop 27, the output signal of the RS flip-flop 27 is inputted to the gates of the transistors 10 and 11 having high driving capabilities, and the gate of the transistor 8 is driven by the drains of the transistors 10 and 11 to control the on/off of the transistor B. As a result, the input pulse signal from the high side input terminal HIN is transformed into the signal having a high voltage level and the signal is outputted to the high side output terminal HO (in reality, there is a slight time lag).

A circuit operation for driving the load 33 at a high-voltage will be more specifically described below.

For example, in a state in which the low side input terminal LIN switches from "L" level to "H" level after the high side input terminal HIN switches from "H" level to "L" level, the RS flip-flop 27 has been already reset and thus the high side output terminal HO is set at "L" level. The transistor 8 is turned off and the transistor 9 is turned on. At this point, the VS terminal voltage is brought close to a grounding state and the VB terminal voltage is a voltage obtained by subtracting the diode voltage of the diode 3 from the voltage of the low voltage power supply 2.

Next, in a state in which the high side input terminal HIN switches from "L" level to "H" level after the low side input terminal LIN switches from "H" level to "L" level, the transistor 9 is turned off and the RS flip-flop 27 has been already set. Thus the high side output terminal HO is set at "H" level and the transistor 8 is turned on, so that the VS terminal voltage is brought close to the voltage of the high voltage power supply 1. At this point, the VB terminal voltage increases with an increase of the VS terminal voltage while keeping in the capacitor 6 the voltage obtained by subtracting the diode voltage of the diode 3 from the voltage of the low voltage power supply 2. The diode 3 prevents backflow of current passing from the VB terminal to the low voltage power supply 2.

The circuit including the RS flip-flop 27 has low power consumption with the VB terminal voltage serving as the upper reference voltage and the VS terminal voltage serving as the lower reference voltage. Thus in a period during which the VS terminal voltage is close to the voltage of the high voltage power supply 1, fluctuations (reductions) in voltage across the terminals of the capacitor 6 are small.

Figure 2:
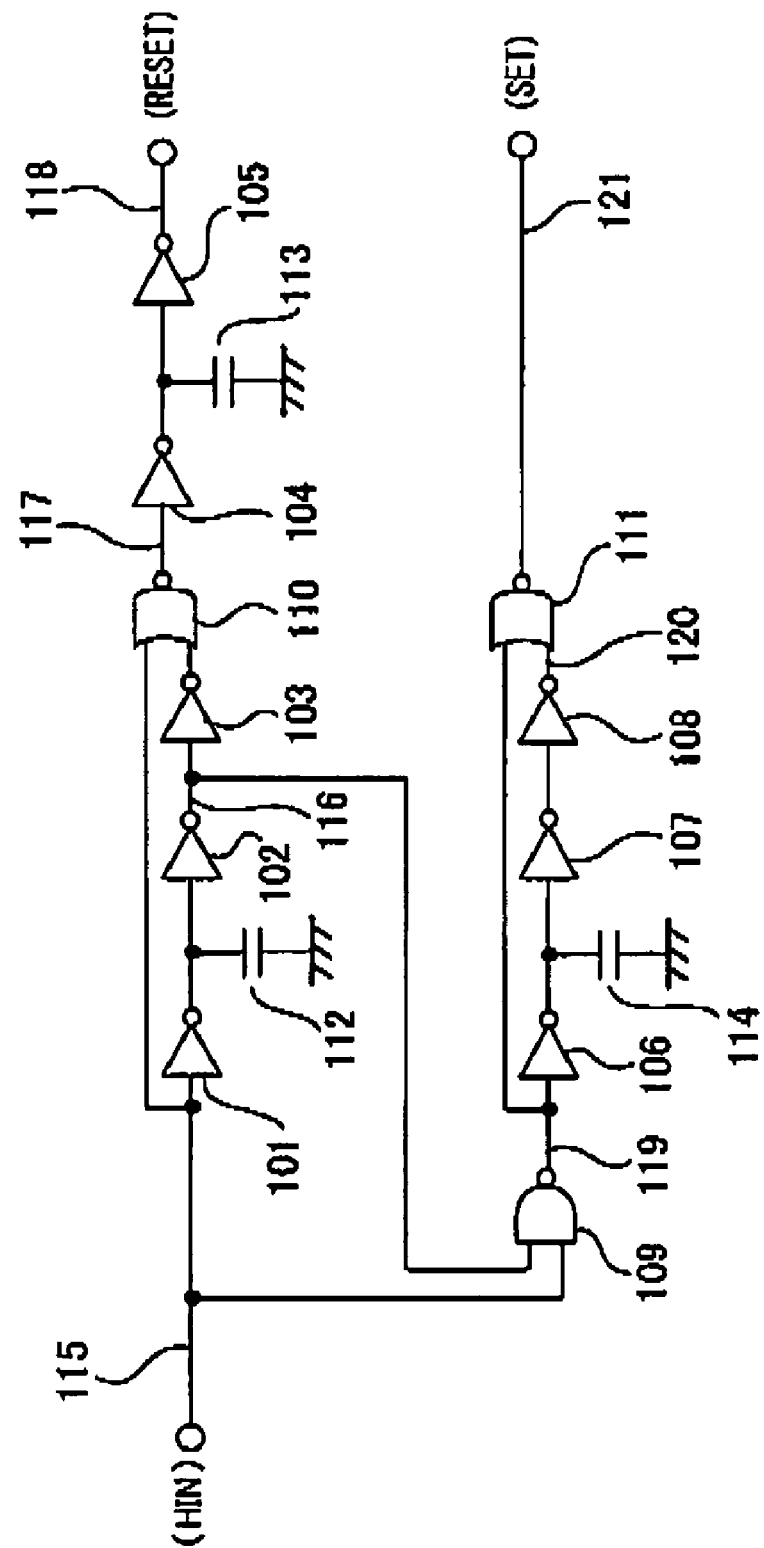
FIG. 2 specifically shows edge detection circuits 35 and 36 according to Embodiment 1.

The operations of the edge detection circuits 35 and 36 of FIG. 1 will be described below with reference to the timing chart of FIG. 3. FIG. 2 shows a circuit example (Japanese Patent Laid-Open No. 2001-168700).

Reference numerals 101, 102, 103, 104, 105, 106, 107 and 108 denote inverters, reference numeral 109 denotes an NAND gate, reference numerals 110 and 111 denote NOR gates, reference numerals 112, 113 and 114 denote capacitors, and reference numerals 115, 116, 117, 118, 119, 120 and 121 denote signal lines. Reference numerals t112, t113 and t114 in FIG. 3 denote an amount of delay made by the capacitor 112 from the input of the inverter 101 to the output of the inverter 102, an amount of delay made by the capacitor 113 from the input of the inverter 104 to the output of the inverter 105, and an amount of delay made by the capacitor 114 from the input of the inverter 106 to the output of the inverter 107.

Figure 3:
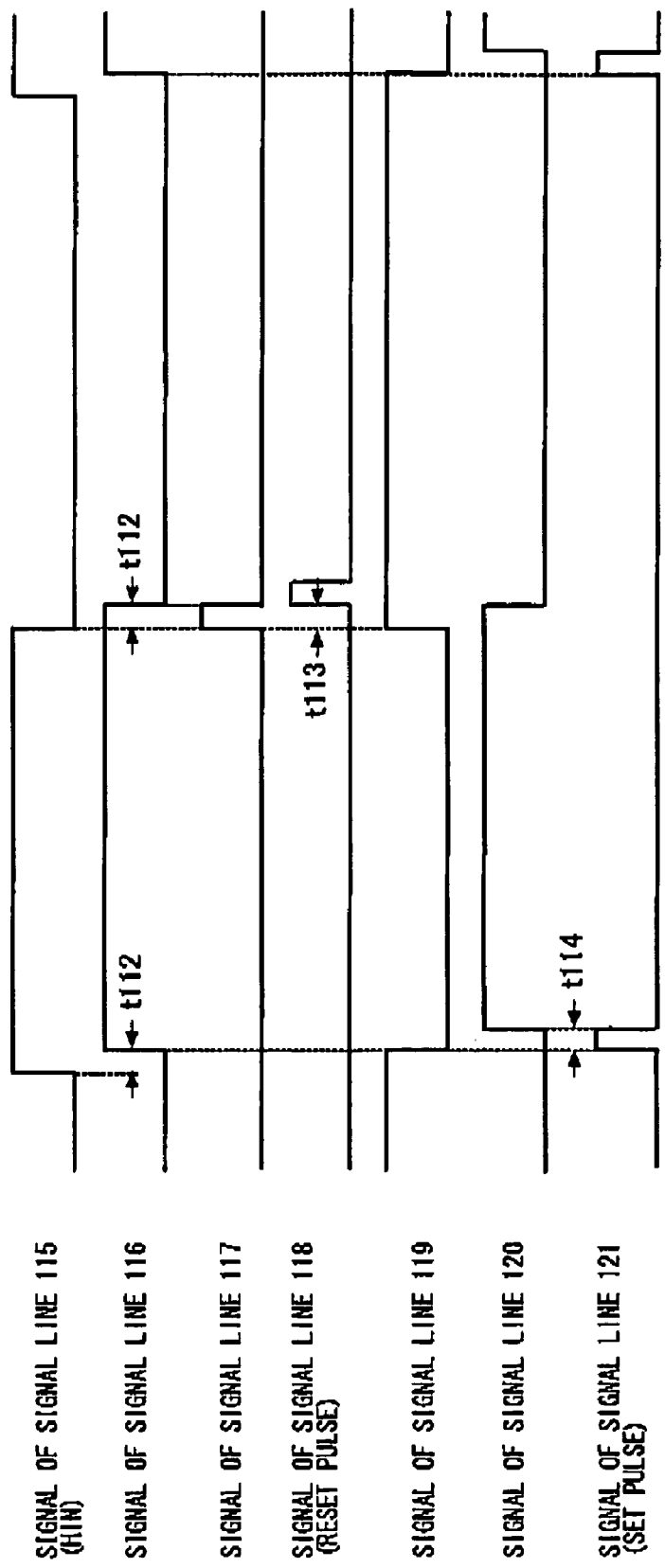
FIG. 3 is a timing chart of the edge detection circuits 35 and 36 according to Embodiment 1.

As shown in the timing chart of FIG. 3, after the time delay t112 from the leading edge of the signal of the signal line 115, the signal serving as an input signal, a set signal having a pulse width of t114 is generated on the signal line 121. After the time delay t112 from the trailing edge of the signal of the signal line 115, a reset signal having a pulse width of t113 is generated on the signal line 118.

The total amount of delay of the delay circuit 28 and the delay circuit 29 is set such that an amount of delay from the high side input terminal HIN to the high side output terminal HO matches with an amount of delay from the low side input terminal LIN to the low side output terminal LO. A signal from the junction point of the delay circuit 28 and the delay circuit 29 is inputted from the signal line 60 to the reset pulse generation circuit 31 for preventing a malfunction. On the signal line 62 serving as the output of the reset pulse generation circuit 31, a pulse is generated which switches from "H" level to "L" level after the delay in the delay circuit 28 since the low side input terminal LIN switches from "L" level to "H" level, and then switches from "L" level to "H" level after a time period determined by the capacitor 7. The pulse is inputted to the NAND gate 25 having the other input fed with the inverted signal of the signal line 51 from the edge detection circuit 36.

In addition to the high voltage level shift circuit for changing the voltage levels of the signals from the signal lines 51 and 52, a high voltage level shift circuit may be provided for changing the voltage level of an inverted signal from the signal line 62, and the signal from the signal line 51 and the signal from the signal line 62 may be combined into a reset signal and inputted to the RS flip-flop 27 after the voltage level is changed. In FIG. 1, the inverted signal from the signal line 51 and the signal from the signal line 62 are combined in the NAND gate 25 and then inputted to the high voltage level shift circuit made up of the transistor 14 and the resistor 4, so that the number of transistors which require a high breakdown voltage and cause an extremely large device size can be reduced from 3 to 2 in the voltage level shift circuit.

Figure 15:
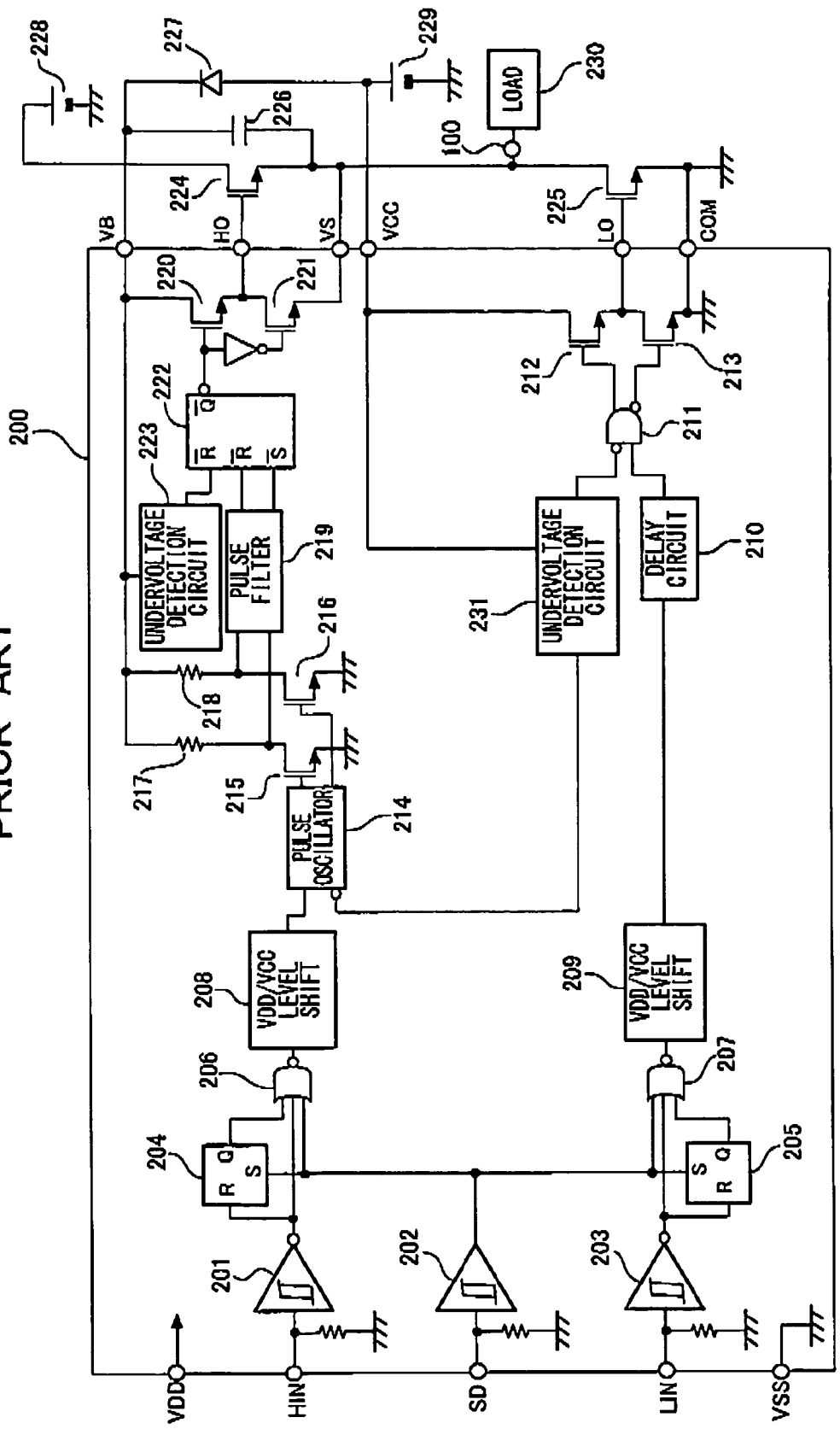
FIG. 15 shows a conventional switching transistor driver circuit.

In the conventional switching transistor driver circuit of FIG. 15, the device for raising the high side output terminal HO and the low side output terminal LO to "H" level is made up of the N-channel transistors 220 and 212. In FIG. 1, such a device is made up of the P-channel transistors 10 and 12 because the "H"-level voltages of the high side output terminal HO and the low side output terminal LO can be increased close to the VB terminal voltage and the VCC terminal voltage and the transistors 8 and 9 can be driven with a low on resistance.

Referring to the timing chart of FIG. 4, the timing relationship of the circuit operations of FIG. 1 will be summarized as below: As described above, it is understood from FIG. 3 that the capacitor 112 of FIG. 2 determines a delay time from the leading edge of the input signal from the high side input terminal HIN to the leading edge of the signal serving as a set signal from the signal line 52 and the capacitor 113 of FIG. 2 determines a delay time from the trailing edge of the high side input terminal HIN to the leading edge of the signal serving as a reset signal from the signal line 51. The delay amounts t112 and t113 are denoted as ta in FIG. 4 and equal to each other as expressed in Equation (1) below:

$$ta = t112 = t113 \tag{1}$$

The amounts of delay between the inputs and outputs of the delay circuits 28 and 29 are denoted as t1 and t2, respectively.

In reality, delays occur on the path along which the transistor 8 is driven from the RS flip-flop 27 and the path along which the transistor 9 is driven from the output of the delay circuit 29. For the sake of simplicity, the former delay is included in the amount of delay from the input of the high voltage level shift circuit to the RS flip-flop 27 and the latter delay is included in the amount of delay of the delay circuit 29.

First, after the low side input terminal LIN switches from "H" level to "L" level, when the high side input terminal HIN switches from "L" level to "H" level, the signal line 64 switches from "H" level to "L" level after (t1+t2) since the low side input terminal LIN switches from "H" level to "L" level. When ta elapses after the high side input terminal HIN switches from "L" level to "H" level, a pulse having a pulse width of t114 is inputted to the signal line 52, the pulse is inputted to the set terminal of the RS flip-flop 27 from the signal line 56 after (t1+t2), the high side output terminal HO switches from "L" level to "H" level, and the VS terminal also switches from "L" level to "H" level.

After the high side input terminal HIN switches from "H" level to "L" level, when the low side input terminal LIN switches from "L" level to "H" level, a pulse having a pulse width of t112 is generated on the signal line 51 after ta since the high side input terminal HIN switches from "H" level to "L" level, a pulse having a pulse width determined by the capacitor 7 is generated on the signal line 62 after t1 since the low side input terminal LIN switches from "L" level to "H" level, two pulses for the signal line 53 are combined in the NAND gate 25, the signal of the signal line 53 is delayed by (t1+t2−ta) and inputted to the reset terminal of the RS flip-flop 27, the high side output terminal HO switches from "H" level to "L" level, the low side output terminal LO switches from "L" level to "H" level after (t1+t2) since the low side input terminal LIN switches from "L" level to "H" level, the transistor 9 is turned on, and the VS terminal voltage rapidly decreases.

Figure 4:
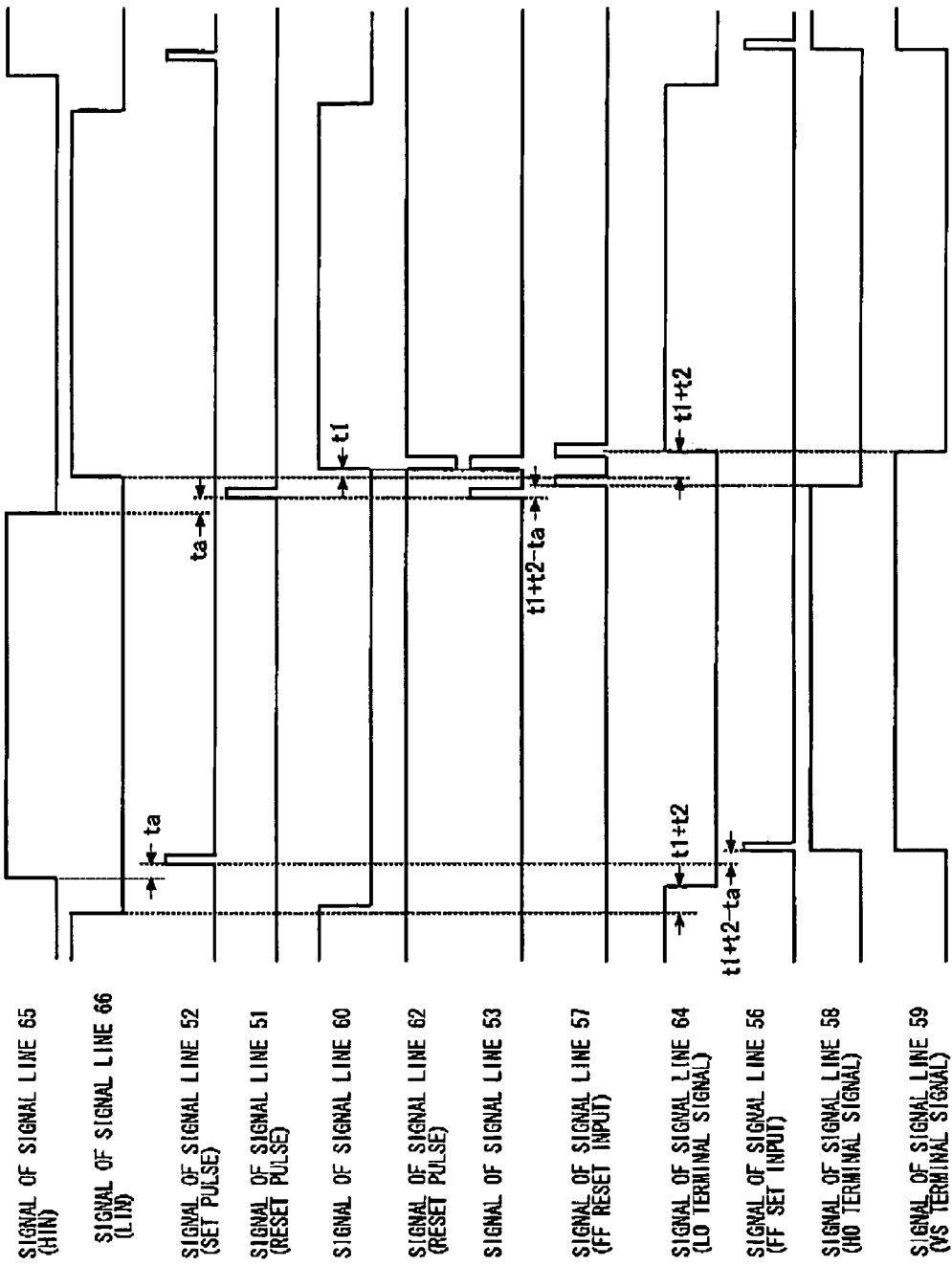
FIG. 4 is a timing chart showing that two reset pulses are generated according to Embodiment 1.

As shown in FIG. 4, the delay circuits 28 and 29 are set such that a period during which the VS terminal voltage rapidly decreases is included in the second pulse of the signal line 57 serving as the reset input to the RS flip-flop 27. The total delay time is matched with a delay time from the high side input terminal HIN to the high side output terminal HO.

In FIG. 4, the decreasing edge of the VS terminal voltage is actually inclined (takes some time to decrease). As a reset period setting method for preventing a through current caused by a malfunction of the RS flip-flop 27 from passing through the transistors 8 and 9 and breaking the transistors 8 and 9, the following configuration is effective: the RS flip-flop 27 is reset in a period including a period during which the VS terminal voltage decreases and including a period around the period, or the RS flip-flop 27 is reset in a period including the latter half period during which the VS terminal voltage decreases and including the subsequent period. Even when the period during which the VS terminal voltage decreases is not included in the period of the second pulse of the signal line 57 serving as the reset input to the RS flip-flop 27 and the second pulse of the signal line 57 is generated immediately after the VS terminal voltage decreases, even in the event of a malfunction of the RS flip-flop 27 immediately after the VS terminal voltage decreases, the RS flip-flop 27 can be quickly reset to cancel the state of malfunction. Thus it is possible to prevent the transistors 8 and 9 from being broken by a malfunction of the RS flip-flop 27.

In reality, in FIG. 4, during a period from when the high side output terminal HO switches from "H" level to "L" level to when the low side output terminal LO switches from "L" level to "H" level, the transistors 8 and 9 are both turned off and the VS terminal voltage is inconstant. When the load 33 includes a coil, current having passed through the load 33 via the transistor 8 from the high voltage power supply 1 passes the load 33 through the transistor 9 from the ground terminal immediately after the high side output terminal HO switches from "H" level to "L" level (the current passes through a parasitic diode having the anode on the grounding side of the transistor 9 and the cathode on the load side in a dead time period during which the transistors 8 and 9 are both turned off). Thus the VS terminal voltage decreases immediately after the high side output terminal HO switches from "H" level to "L" level, so that the reset period of the RS flip-flop 27 may be set according to the timing of the decrease. This holds true in the subsequent embodiments.

Figure 5:
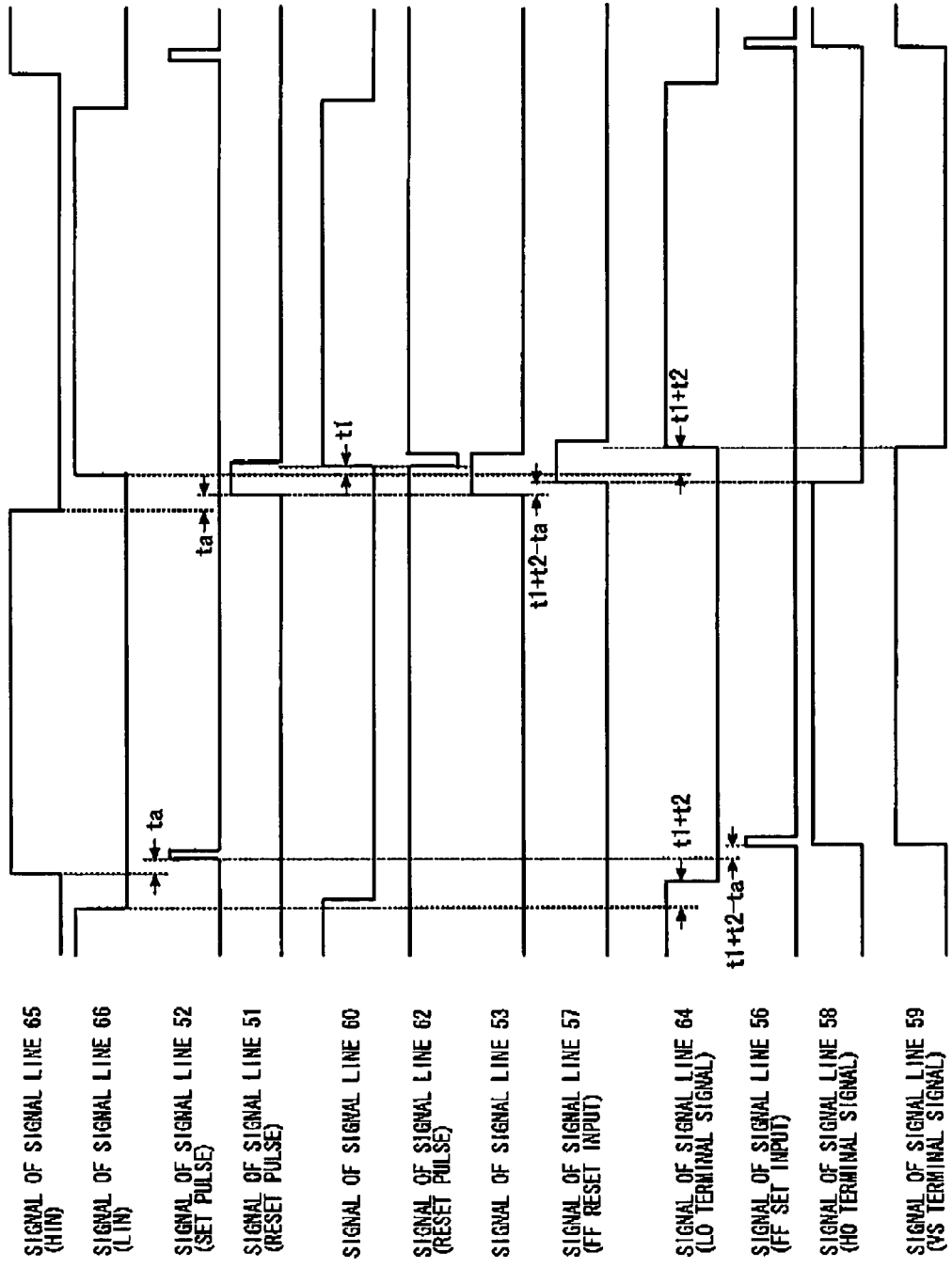
FIG. 5 is a timing chart showing that the reset pulses are combined into one according to Embodiment 1.

When it is desired to easily set the timing and accurately reset the RS flip-flop 27, as shown in the timing chart of FIG. 5, a large pulse width is set for the signal line 51 and superimposed on the second pulse generated by the reset pulse generation circuit 31. The pulses are combined into a single pulse such that the reset start timing is determined by the signal transmitted from the edge detection circuit 36 as the signal of the signal line 57 serving as the reset input to the RS flip-flop 27 and the reset end timing is determined by the signal from the reset pulse generation circuit 31. The timing can be easily set particularly when the load 33 includes a coil.

With this configuration, in a period during which the VS terminal voltage rapidly decreases from a high potential to a low potential, that is, in a period during which the RS flip-flop may malfunction due to the influence of dv/dt transient phenomena and the transistors 8 and 9 may be broken by a through current, the RS flip-flop 27 is reset. Thus the RS flip-flop 27 does not malfunction due to the influence of dv/dt transient phenomena and the transistors 8 and 9 are not broken.

Switching transistor driver circuits according to Embodiments 2 to 5 of the present invention can achieve the same effect.

Embodiment 2

The following will describe a switching transistor driver circuit according to Embodiment 2 of the present invention.

Figure 6:
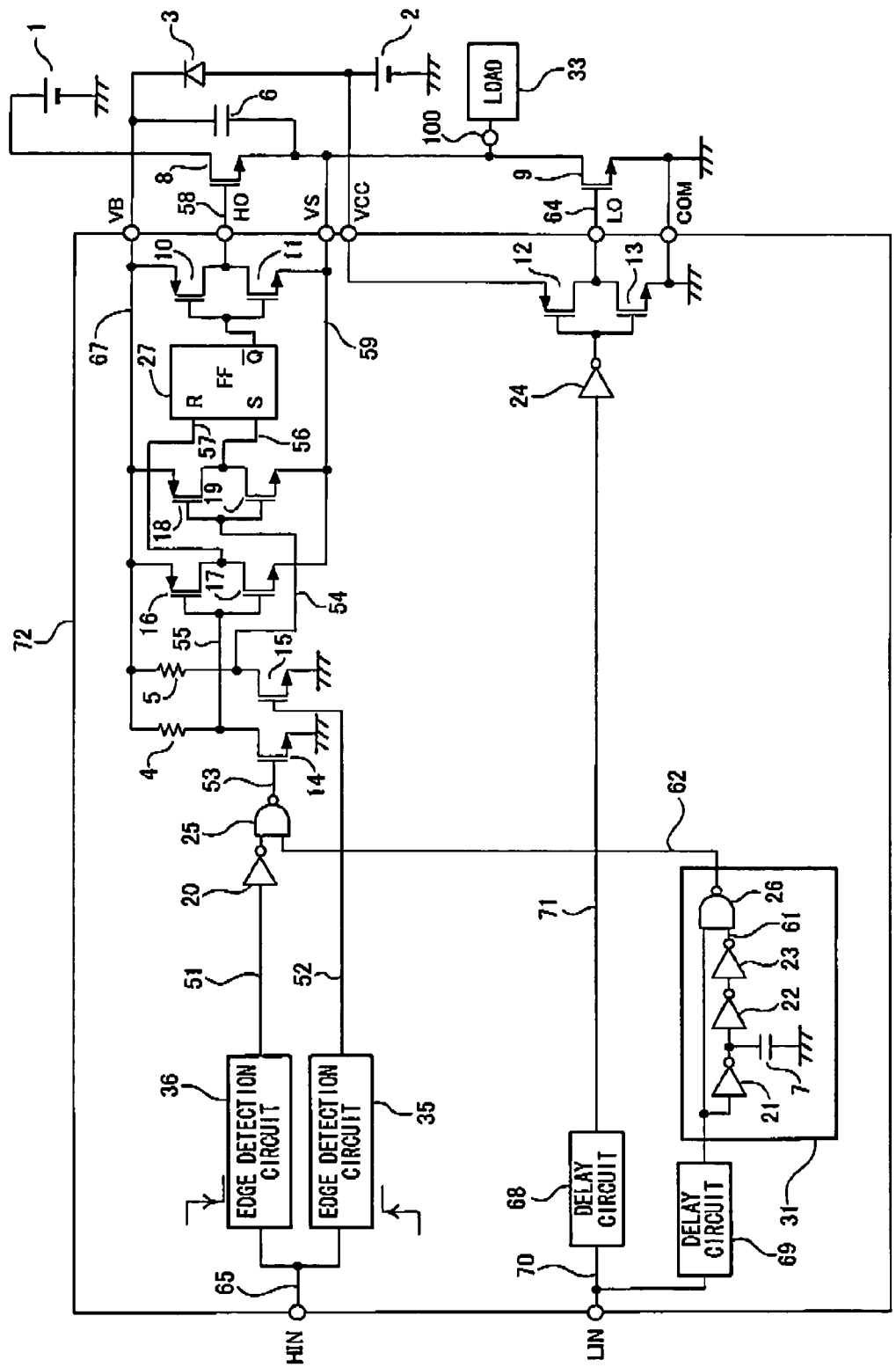
FIG. 6 is a switching transistor driver circuit according to Embodiment 2 of the present invention.

FIG. 6 shows the switching transistor driver circuit of the present invention. Reference numeral 68 denotes a delay circuit obtained by combining the delay circuit 28 and the delay circuit 29 of FIG. 1, reference numeral 69 denotes a delay circuit having a low side input terminal LIN as an input and an output connected to the input of a reset pulse generation circuit 31, reference numerals 70 and 71 denote signal lines, and reference numeral 72 denotes a circuit included in a semiconductor integrated circuit. Other components are similar to those of FIG. 1.

In FIG. 1, a delay time from the low side input terminal LIN to the reset pulse generation circuit 31 is set by the delay circuit 28. FIG. 6 is different only in that the delay circuit 69 is additionally provided between the low side input terminal LIN and the reset pulse generation circuit 31. The timing chart of this circuit is similar to those of FIGS. 4 and 5 used for explaining FIG. 1. The total amount of delay (t1+t2) of the delay circuit 28 and the delay circuit 29 in FIG. 1 is equal to a delay amount t3 of the delay circuit 68 in FIG. 6, and a delay amount t4 of the delay circuit 69 in FIG. 6 is equal to the delay amount t1 of the delay circuit 28 in FIG. 1.

The same operations are performed also when the delay circuit 69 is disposed between the reset pulse generation circuit 31 and an NAND gate 25.

Embodiment 3

A switching transistor driver circuit according to Embodiment 3 of the present invention will now be described below.

Figure 7:
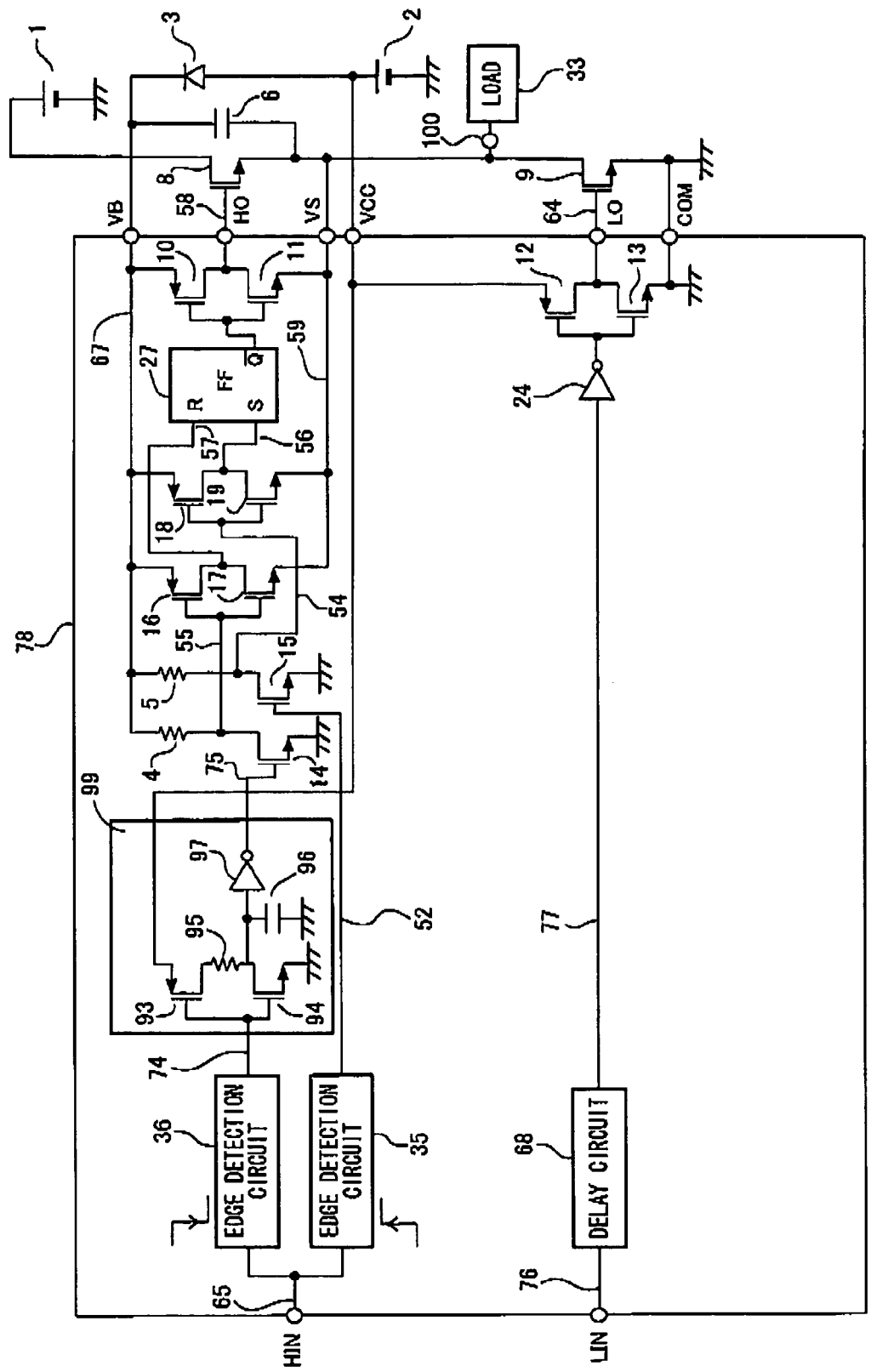
FIG. 7 is a switching transistor driver circuit according to Embodiment 3 of the present invention.

FIG. 7 shows the switching transistor driver circuit of the present invention. Reference numeral 68 denotes a delay circuit obtained by combining the delay circuit 28 and the delay circuit 29 of FIG. 1, reference numeral 93 denotes a P-channel MOS transistor (hereinafter, will be referred to as a transistor), reference numeral 94 denotes an N-channel MOS transistor (hereinafter, will be referred to as a transistor), reference numeral 95 denotes a resistor, reference numeral 96 denotes a capacitor, reference numeral 97 denotes an inverter, reference numeral 99 denotes a delay circuit, reference numerals 74, 75, 76 and 77 denote signal lines, and reference numeral 78 denotes a circuit included in a semiconductor integrated circuit. Other components are similar to those of FIG. 1.

Figure 8:
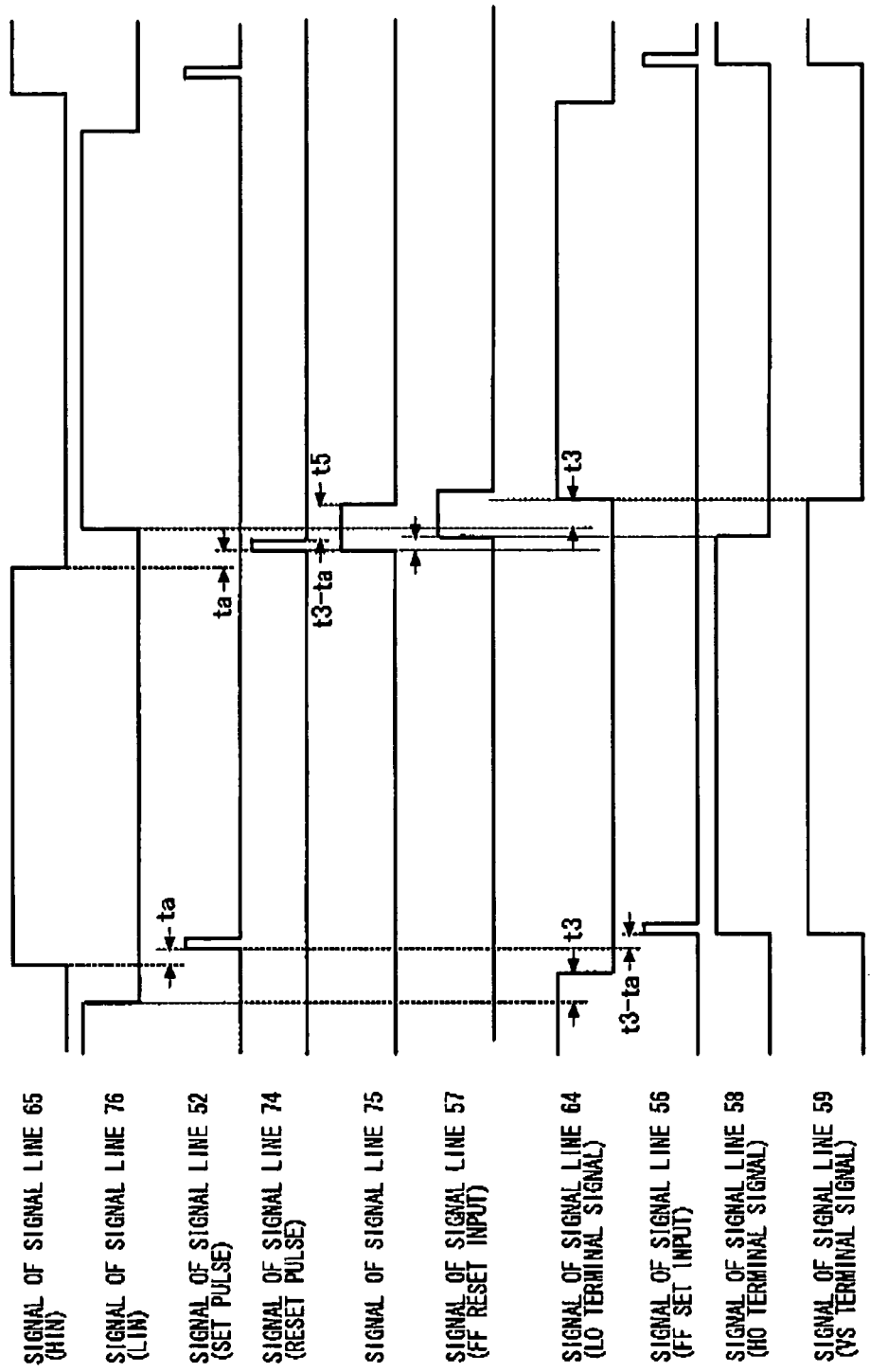
FIG. 8 is a timing chart of Embodiment 3.

FIG. 8 is a timing chart for explaining the circuit operations of FIG. 7. Reference numeral t3 denotes the amount of delay between the input and output of the delay circuit 68, and reference numeral t5 denotes the amount of delay of the trailing edge of a signal inputted to the delay circuit 99.

FIG. 7 is different from FIG. 1 in that the reset pulse generation circuit 31 of FIG. 1 is omitted and instead of the reset pulse generation circuit 31, the delay circuit 99 delays the trailing edge of the signal of the signal line 74 from an edge detection circuit 36 having detected the trailing edge of the signal line 65 serving as an input from a high side input terminal HIN, and an RS flip-flop 27 can be reset in a period during which a VS terminal voltage decreases.

In the case where a small difference in duty between the high side input terminal HIN and a high side output terminal HO does not cause any problems, not only the trailing edge of the signal line 74 but also the leading edge of the signal line 74 are delayed at the same time, so that power consumption can be reduced in a high voltage level shift circuit.

Embodiment 4

A switching transistor driver circuit according to Embodiment 4 of the present invention will now be described below.

Figure 9:
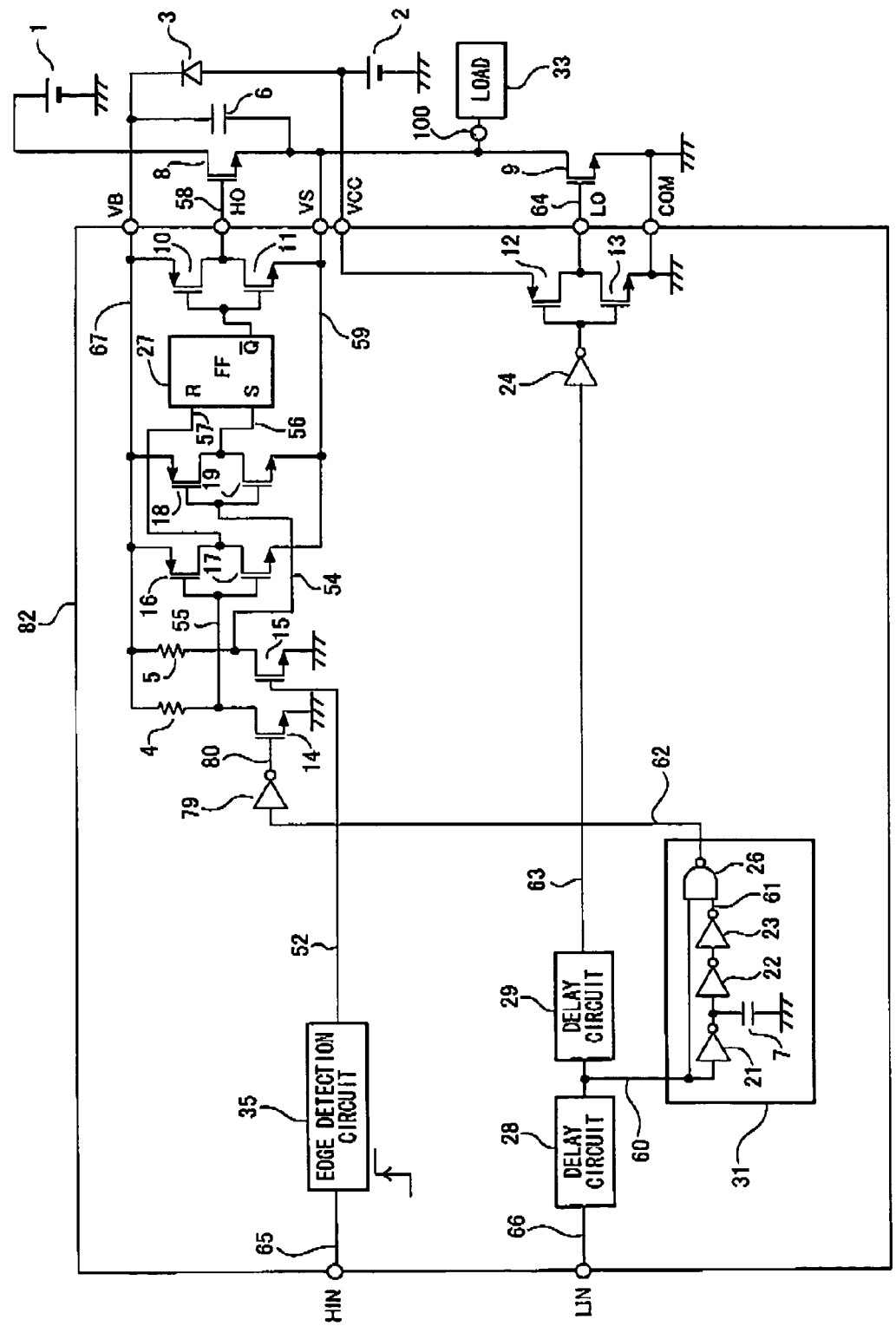
FIG. 9 is a switching transistor driver circuit according to Embodiment 4 of the present invention.

FIG. 9 shows the switching transistor driver circuit of the present invention. Reference numeral 79 denotes an inverter, reference numeral 80 denotes a signal line of the output of the inverter 79, and reference numeral 62 denotes a circuit included in a semiconductor integrated circuit. Other components are similar to those of FIG. 1. The series circuit of a delay circuit 28 and a delay circuit 29 corresponds to the "delay circuits" of claims 3 and 10.

Figure 10:
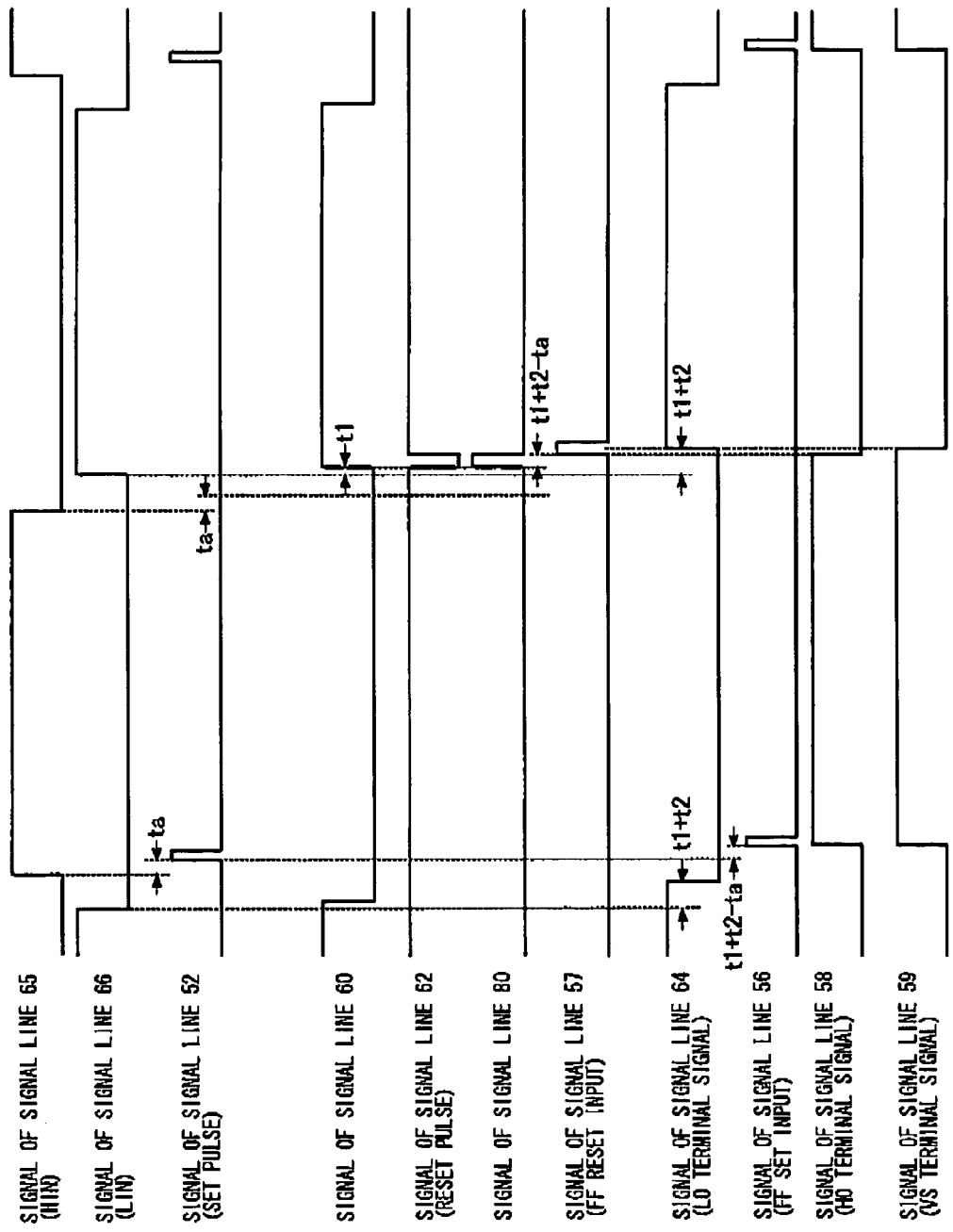
FIG. 10 is a timing chart of Embodiment 4.

FIG. 10 is a timing chart for explaining the circuit operations of FIG. 9. FIG. 9 is different from FIG. 1 in that the signal of the signal line 51 serving as the output of the edge detection circuit 36 in FIG. 1 is omitted, the reset input to an RS flip-flop 27 is only fed with a signal from a reset pulse generation circuit 31, the RS flip-flop 27 is reset in the falling period of the VS terminal, the start timing of the reset period is set according to the setting of an amount of delay in the delay circuit 28, and the duration of a reset period is set by the reset pulse generation circuit 31.

In order to match the duty of a high side input terminal HIN and the duty of a high side output terminal HO as much as possible, it is preferable to minimize a delay time t1 in the delay circuit 28. Consequently, t2 is increased with a reduction of t1.

Embodiment 5

A switching transistor driver circuit according to Embodiment 5 of the present invention will now be described below.

Figure 11:
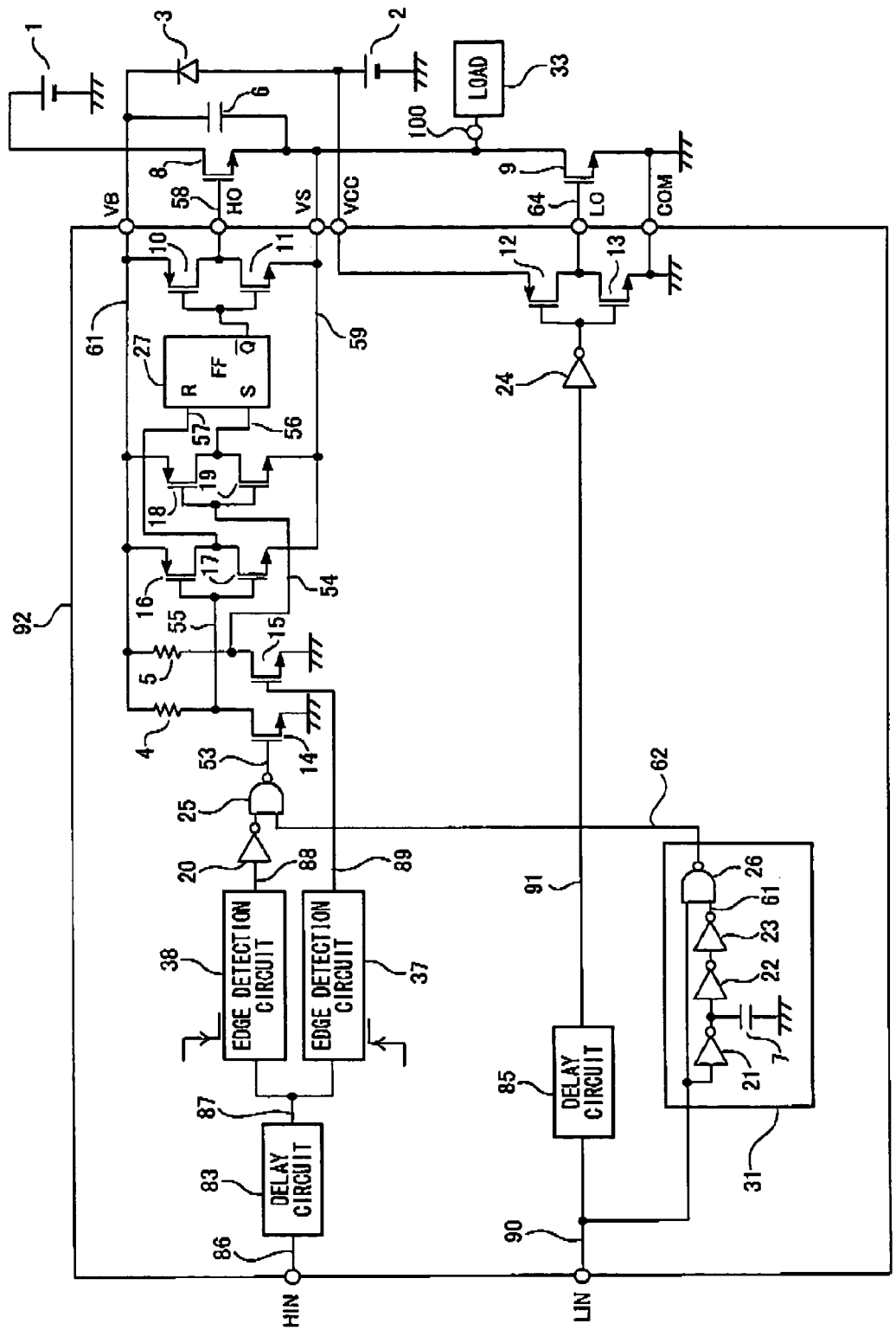
FIG. 11 shows a switching transistor driver circuit according to Embodiment 5 of the present invention.

FIG. 11 shows the switching transistor driver circuit of the present invention. Reference numeral 83 denotes a delay circuit for delaying the signal of a signal line 86 from a high side input terminal HIN and outputting the signal to a signal line 87. Reference numeral 37 denotes an edge detection circuit for detecting a rising edge serving as the leading edge of the signal line 87 and outputting a signal to a signal line 89. Reference numeral 38 denotes an edge detection circuit for detecting a falling edge serving as the trailing edge of the signal line 87 and outputting a signal to a signal line 88. Reference numeral 85 denotes a delay circuit for delaying the signal of a signal line 90 from a low side input terminal LIN and outputting the signal to a signal line 91. The main part of the switching transistor driver circuit is integrated in a semiconductor integrated circuit 92. Other configurations are similar to those of FIG. 1.

Figure 16:
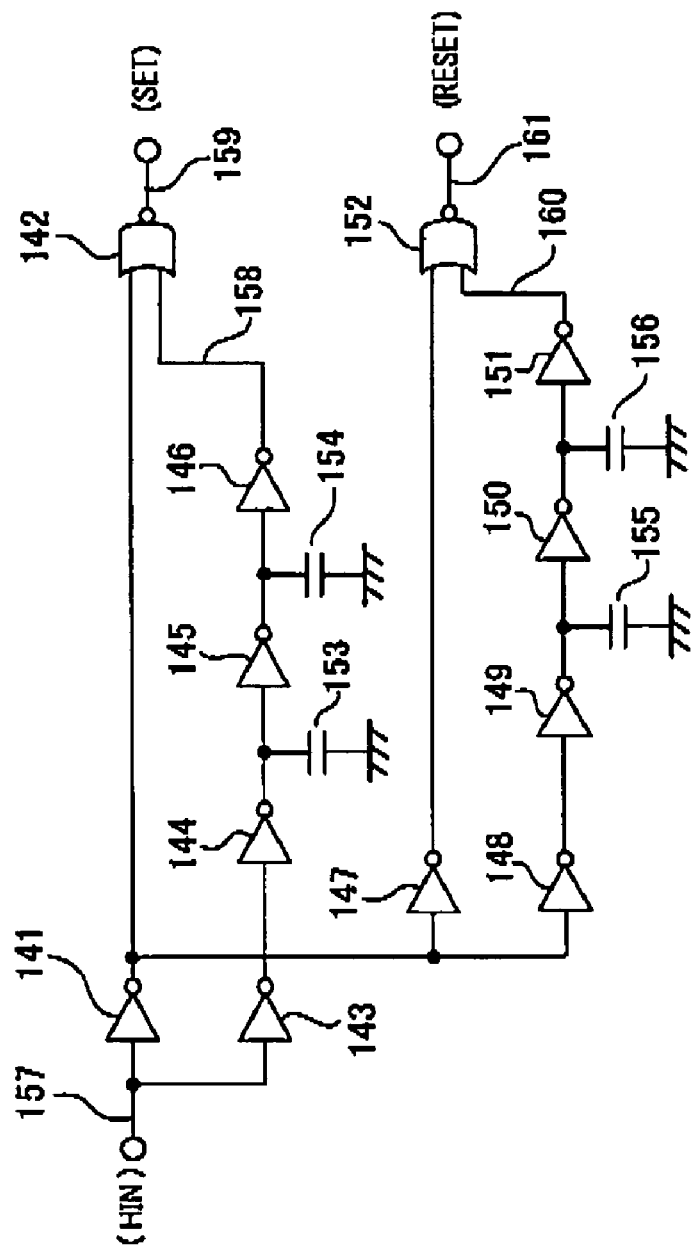
FIG. 16 shows a specific circuit example of a pulse oscillator 214 of a conventional example and edge detection circuits 37 and 38 of Embodiment 5 of the present invention.

FIG. 16 shows a specific structural example of the edge detection circuit 37 serving as a first edge detection circuit and the edge detection circuit 38 serving as a second edge detection circuit. The edge detection circuits 37 and 38 are the constituent elements of FIG. 11. The circuit operations will be described below with reference to the timing chart of FIG. 17.

Reference numerals 141, 143, 144, 145, 146, 147, 148, 149, 150 and 151 denote inverters, reference numerals 142 and 152 denote NOR gates, reference numerals 153, 154, 155 and 156 denote capacitors, reference numerals 157, 158, 159, 160 and 161 denote signal lines, reference numeral 157 denotes an input signal from the output (signal line 87) of the delay circuit 83 of FIG. 11, reference numeral 159 denotes an output signal to the gate (signal line 89) of the transistor 15, and reference numeral 161 denotes an output signal to the input (signal line 88) of the inverter 20.

Figure 17:
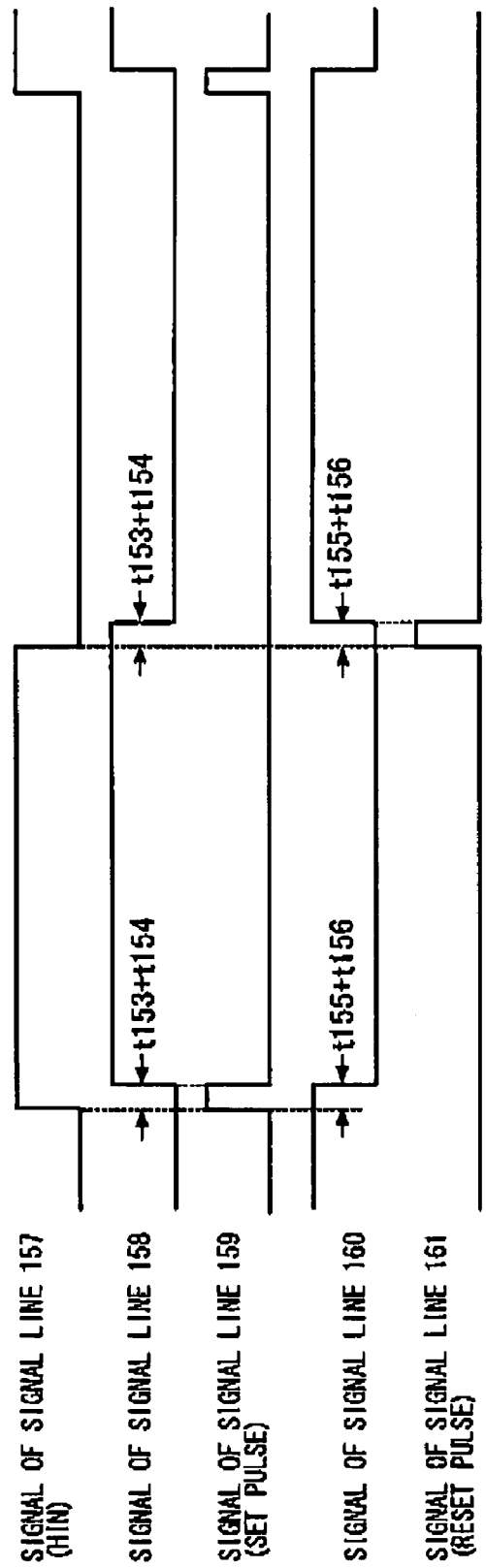
FIG. 17 is a timing chart showing the pulse oscillator 214 of the conventional example.
Figure 18:
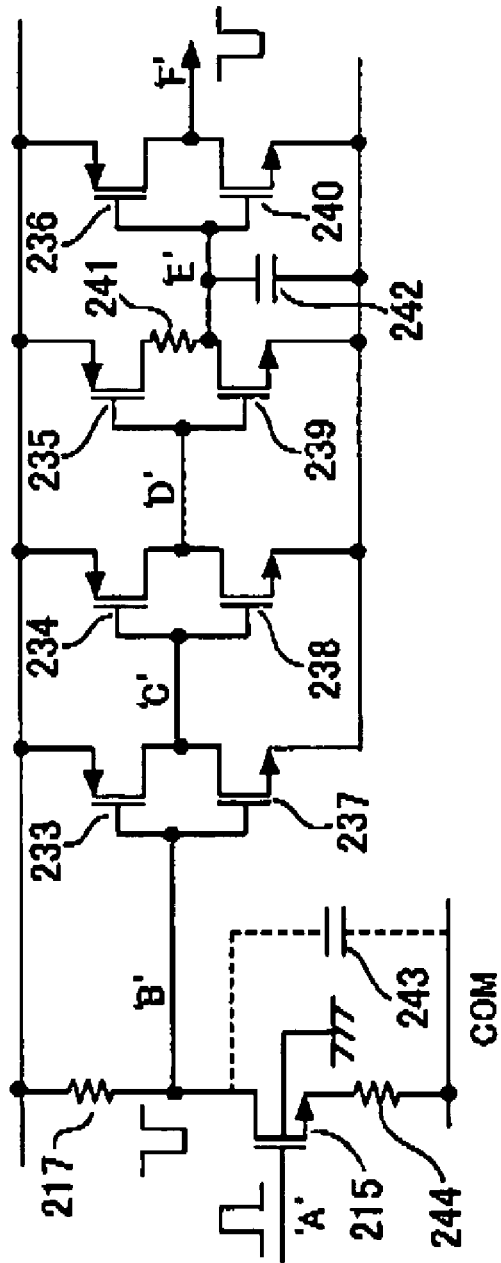
FIG. 18 is a circuit diagram showing one of pulse filters 219 of the conventional example.
Figure 19:
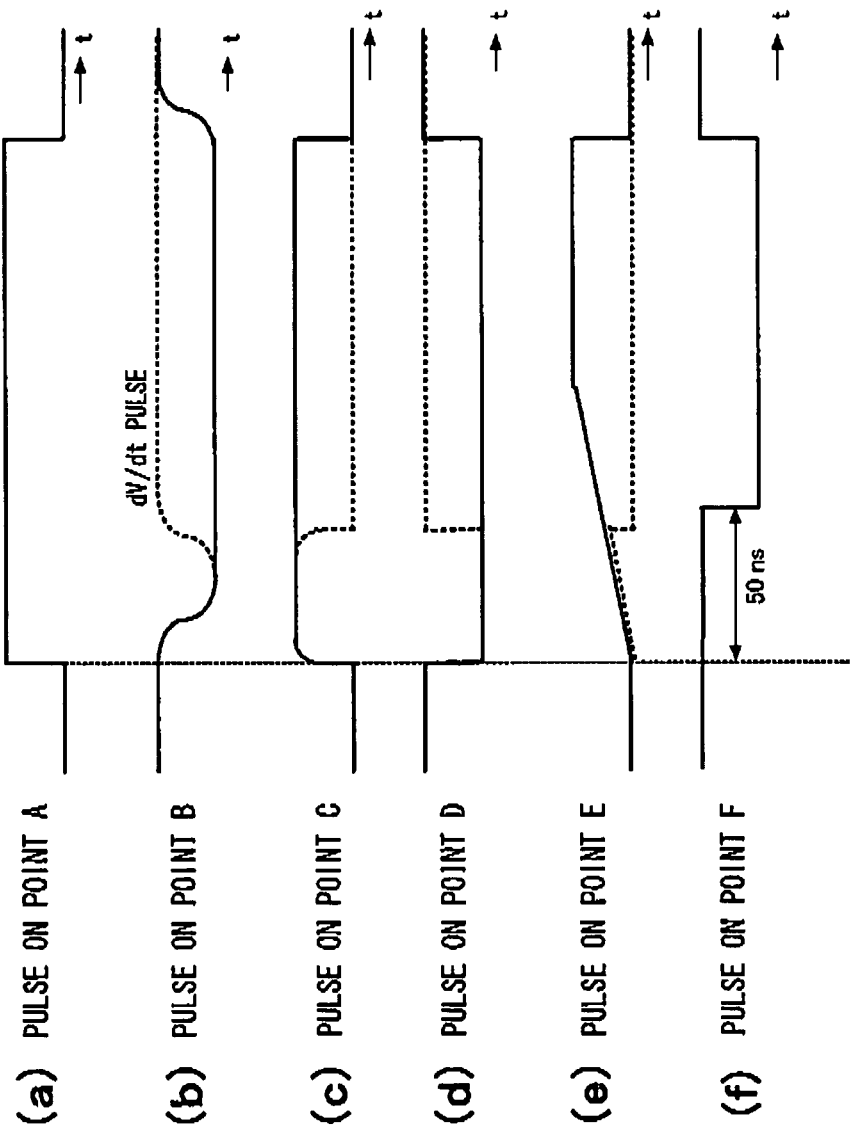
FIG. 19 is a timing chart of FIG. 18.

In FIG. 17, (t153+t154) represents an amount of delay caused by the capacitors 153 and 154 of FIG. 16 and (t115+t156) represents an amount of delay caused by the capacitors 155 and 156 of FIG. 16.

A signal from the high side input terminal HIN is delayed by the delay circuit 83 and then inputted to the signal line 157 serving as the input of the edge detection circuits 37 and 38, a signal obtained by delaying the signal of the signal line 157 is outputted to the output (the signal line 158) of the inverter 146, and a signal obtained by delaying and inverting the signal of the signal line 157 is outputted to the output (the signal line 160) of the inverter 151. Thus a thin pulse where the leading edge of the signal of the signal line 157 has been detected is outputted to the output (the signal line 159) of a NOR gate 142, a thin pulse where the trailing edge of the signal of the signal line 157 has been detected is outputted to the output (the signal line 161) of a NOR gate 152, the signal of the output (the signal line 159) of the NOR gate 142 is inputted to the set input terminal of the RS flip-flop 27 via the high voltage level shift circuit and the inverter of FIG. 11, and the signal of the output (the signal line 161) of the NOR gate 152 is inputted to the reset input terminal of the RS flip-flop 27 via the high voltage level shift circuit and the inverter.

In the edge detection circuits 35 and 36 of FIG. 1, as shown in FIG. 3, a signal delayed by t112 from the leading edge of the high side input terminal HIN and a signal delayed by t113 from the trailing edge of the high side input terminal HIN are outputted from the signal lines 52 and 51. The edge detection circuits 37 and 38 of FIG. 11 are configured as shown in FIG. 16. As shown in the timing chart of FIG. 17, the signals of the signal lines 159(89) and 161(88) are not delayed from the leading edge and the trailing edge of the high side input terminal HIN. Instead, the delay circuit 83 is provided between the high side input terminal HIN and the edge detection circuits 37 and 38.

The edge detection circuits 35 and 36 of FIG. 2 are used in Embodiments 1 to 4 and the edge detection circuits 37 and 38 of FIG. 16 are used in Embodiment 5. However, the edge detection circuits 37 and 38 of FIG. 16 may be used in Embodiments 1 to 4 and the edge detection circuits 35 and 36 of FIG. 2 may be used in Embodiment 5.

Figure 12:
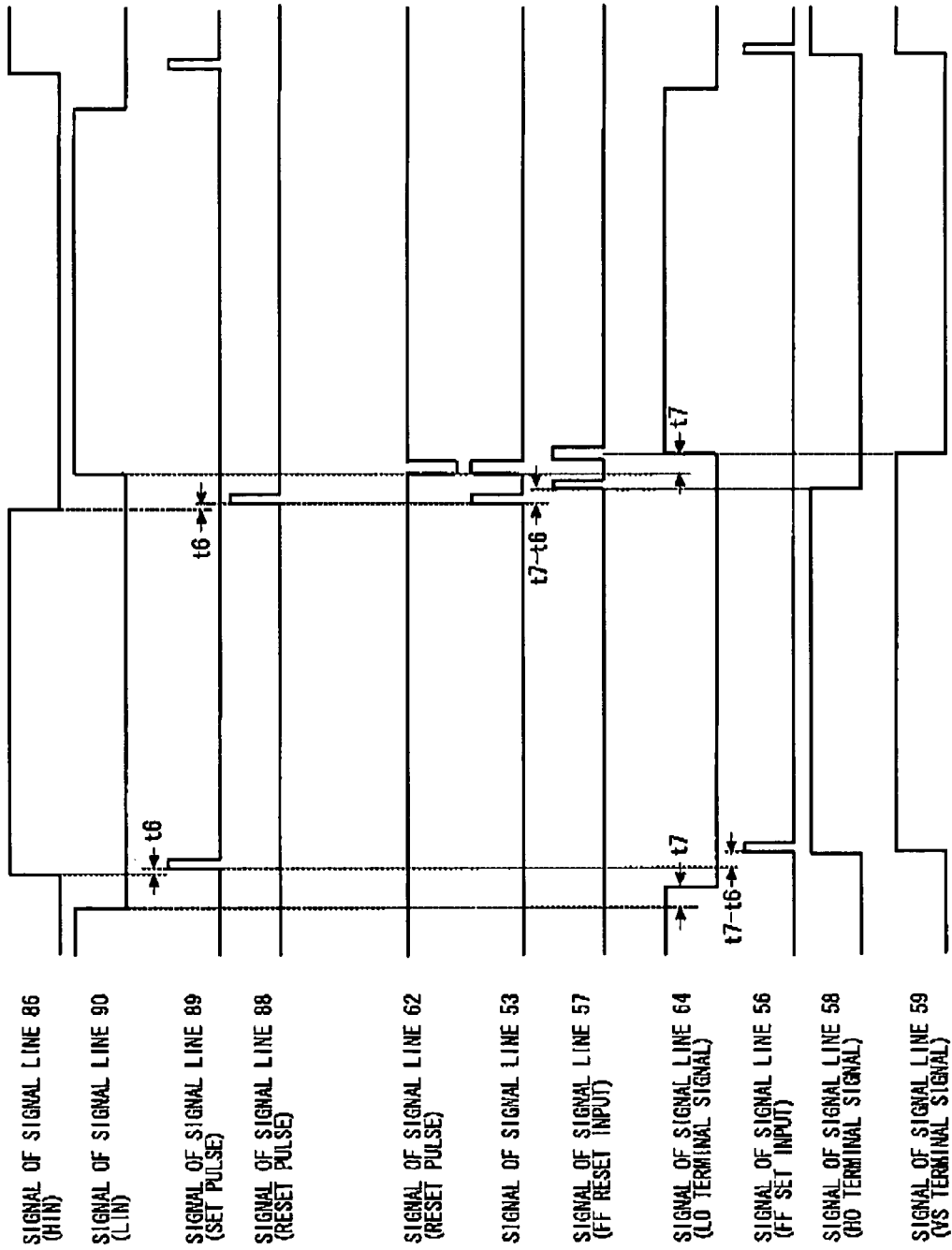
FIG. 12 is a timing chart of Embodiment 5.

FIG. 12 is a timing chart for explaining the circuit operations of FIG. 11. Reference numeral t6 denotes an amount of delay between the input and output of the delay circuit 83 and reference numeral t7 denotes an amount of delay between the input and output of the delay circuit 85. Timing is adjusted such that the RS flip-flop 27 is reset in the falling period of a VS terminal. When the delay amount of the delay circuit 83 is too large, the delay amount is adjusted such that the signal of the signal line 62 from the reset pulse generation circuit 31 is delayed as shown in FIGS. 1 and 6 and the RS flip-flop 27 is reset in the falling period of the VS terminal. The delay circuit 83 may be provided on the outputs of the edge detection circuits 37 and 38.

Embodiment 6

A switching transistor driver circuit according to Embodiment 6 of the present invention will now be described below.

Figure 13:
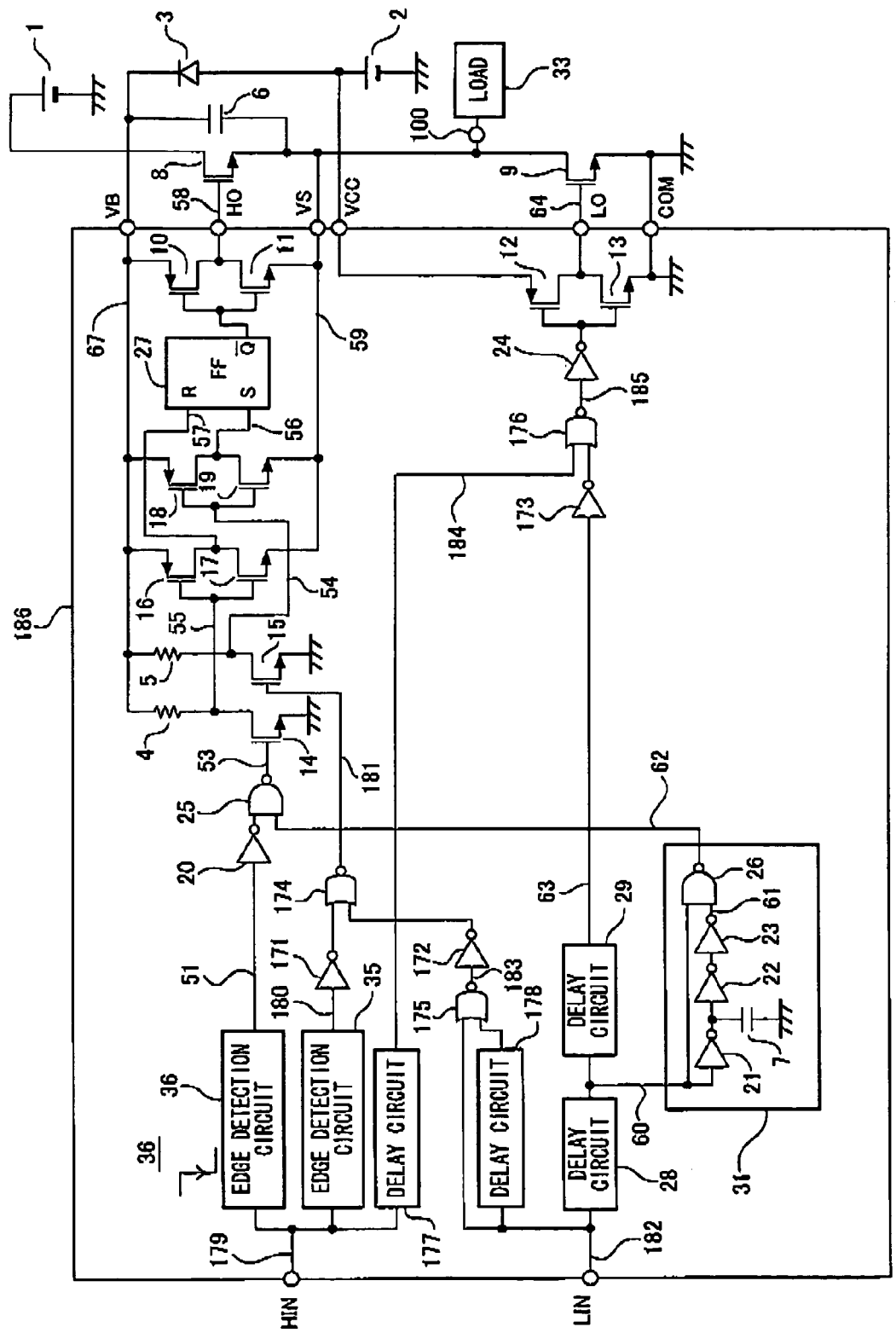
FIG. 13 shows a switching transistor driver circuit according to Embodiment 6 of the present invention.

FIG. 13 shows the switching transistor driver circuit of the present invention. Reference numerals 171, 172 and 173 denote inverters, reference numerals 174, 175 and 176 denote NOR gates, reference numerals 177 and 178 denote delay circuits, reference numerals 179, 180, 181, 182, 183, 184 and 185 denote signal lines, and reference numeral 186 denotes a circuit included in a semiconductor integrated circuit. Other components are similar to those of FIG. 1.

Figure 14:
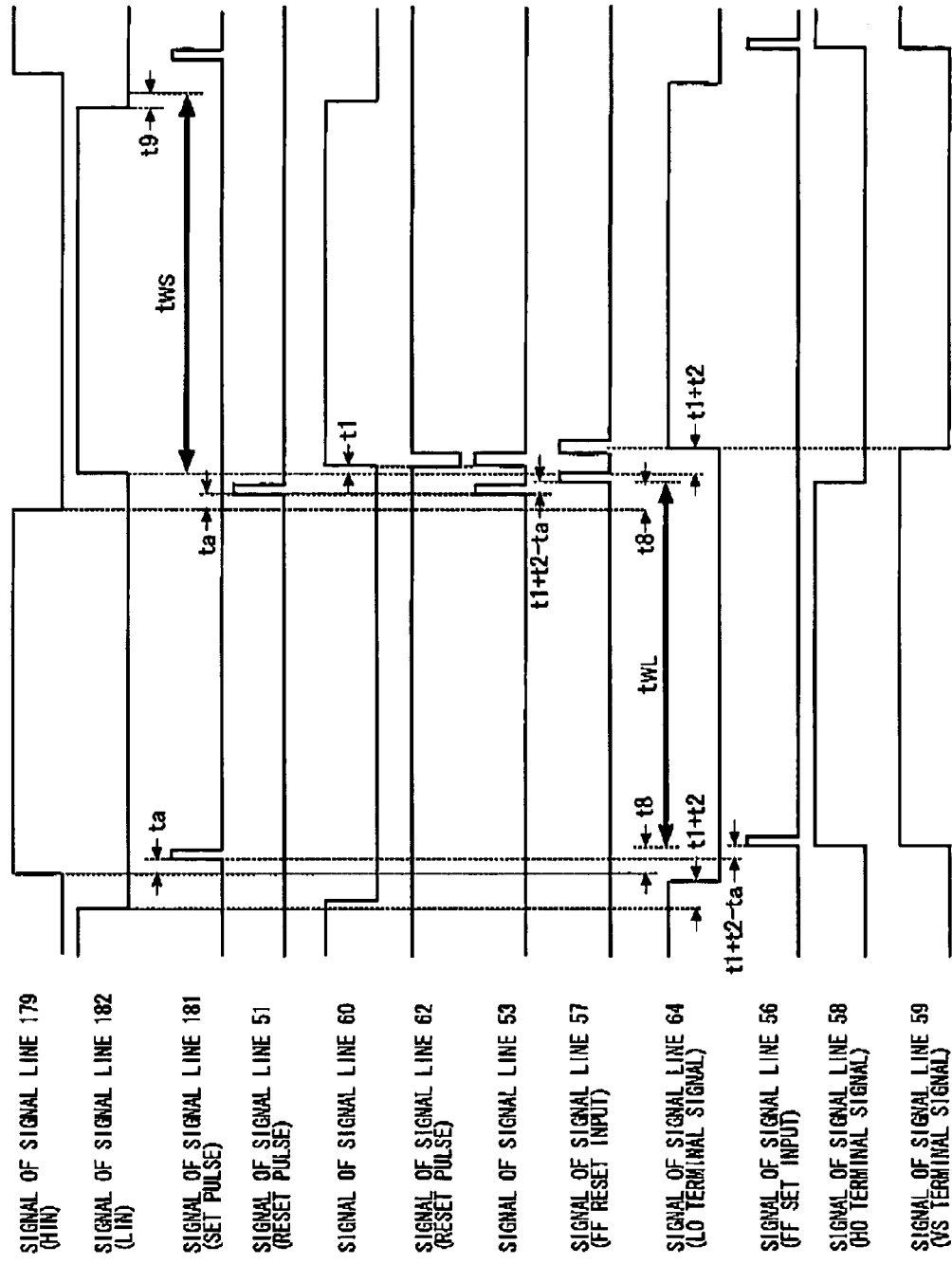
FIG. 14 is a timing chart of Embodiment 6.

FIG. 14 is a timing chart for explaining the circuit operations of FIG. 13. Reference numeral t8 denotes an amount of delay between the input and output of the delay circuit 177, reference numeral t9 denotes an amount of delay between the input and output of the delay circuit 178, reference character tws denotes a period in which a signal serving as the set input to an RS flip-flop 27 is prohibited from being inputted to the signal line 181, and reference character twL denotes a period during which a signal for setting a signal line 64 at "H" level is prohibited from being inputted to the signal line 185.

The circuit of FIG. 13 is configured such that measures are taken to suppress noise on the set input terminal of the RS flip-flop 27 in the configuration of FIG. 1. Further, a transistor 9 is prevented from being turned on by noise or the like when a transistor 8 is turned on. The configuration of FIG. 13 may be combined with embodiments other than Embodiment 1.

In the timing chart of FIG. 14, the RS flip-flop 27 is reset by the signal of a signal line 57 in a period during which the voltage of a VS terminal decreases. In a tws period from when a low side input terminal LIN switches from "L" level to "H" level before the VS terminal voltage decreases, the signal line 181 serving as the input of a high voltage level shift circuit for feeding a signal to the set input of the RS flip-flop 27 is prohibited from feeding the signal to the set input. Thus even in the absence of the pulse filter of the conventional switching transistor driver circuit of FIG. 15, the RS flip-flop 27 does not malfunction due to noise.

In a period during which the transistor 9 is turned off while a low side output terminal LO is set at "L" level, in a twL period, the low side output terminal LO is prohibited from being set at "H" level on a point quite close to the low side output terminal LO. Thus even when noise is inputted to a path from the low side input terminal LIN to the low side output terminal LO while the transistor 8 is turned on, it is possible to prevent a through current from passing through a ground terminal via the transistors 8 and 9 from a high voltage power supply 1. Particularly when a delay amount t8 matches with (t1+t2), the transistor 9 is forcibly turned off in a period during which the transistor 8 is turned on, thereby considerably reducing the possibility of the occurrence of the through current caused by noise or the like.

As described above, according to the configuration of Embodiment 6 of the present invention, from the reset of the RS flip-flop 27 until immediately before a normal set signal other than noise is inputted to the RS flip-flop 27 based on a signal from a high side input terminal HIN, noise or the like which is not normal is prevented from being inputted to the set terminal of the RS flip-flop 27, immediately before the high-voltage level shift circuit closest to the RS flip-flop 27. Further, in a period during which the transistor 8 is turned on, the transistor 9 is not turned on at the closest point to the transistor 9 such that the transistor 9 is not turned on even when noise is inputted to a circuit path from the low side input terminal LIN to the gate of the transistor 9. Thus by combining the configuration of Embodiment 6 with the switching transistor driver circuits according to Embodiments 1 to 5 of the present invention, even in the absence of the pulse filter 219 of the conventional switching transistor driver circuit shown in FIG. 15 (or even when the time constant is small and the noise removal level is low), it is possible to prevent the RS flip-flop 27 from malfunctioning due to dv/dt transient phenomena.

In this configuration, the NOR gate 175 detects the logical sum of the signal of the signal line 182 and the output signal of the delay circuit 178 to prohibit set input to the RS flip-flop 27 from the signal line 183 to the signal line 181 through the inverter 172 and the NOR gate 174. The set input to the RS flip-flop 27 may be prohibited by the signal of the signal line 182 or the output signal of the delay circuit 178 without the provision of the NOR gate 175.

Figure 20:
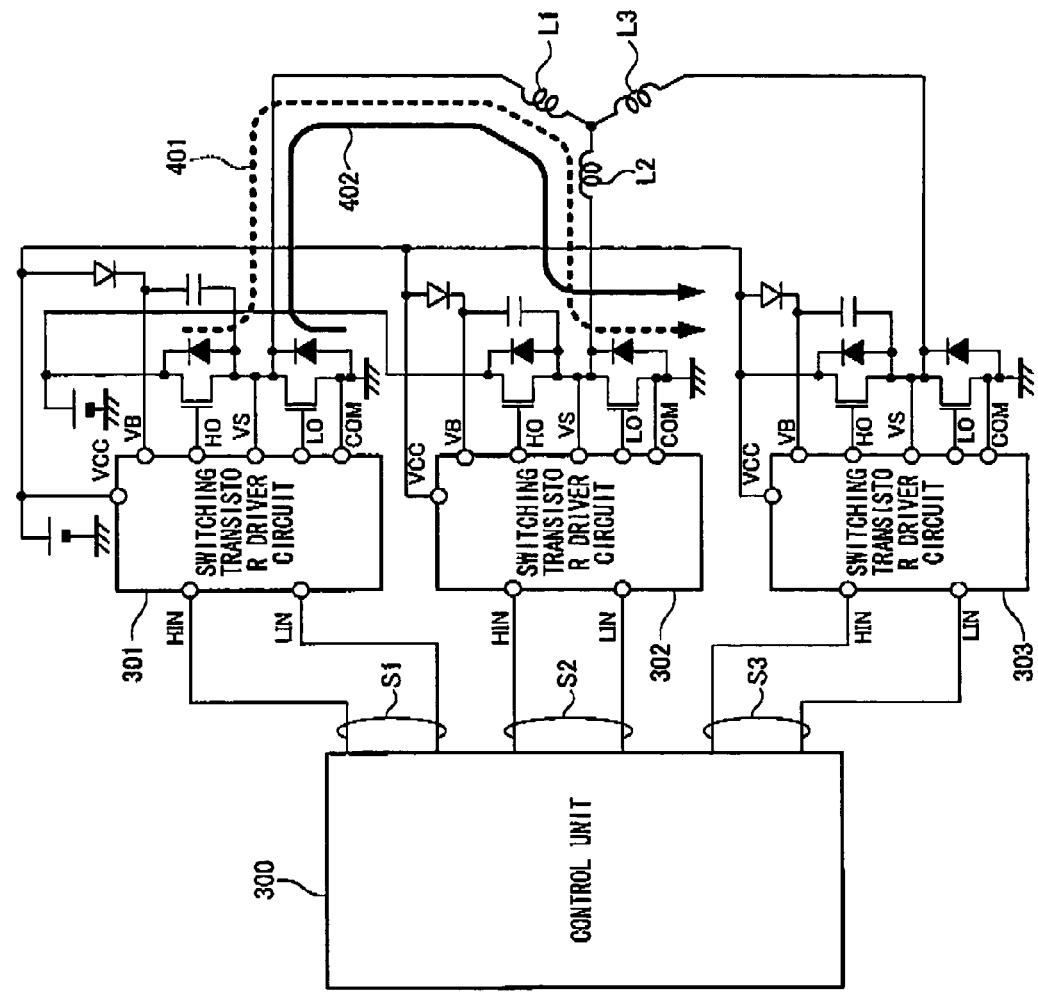
FIG. 20 is a connection diagram of an inductive load.
Figure 21:
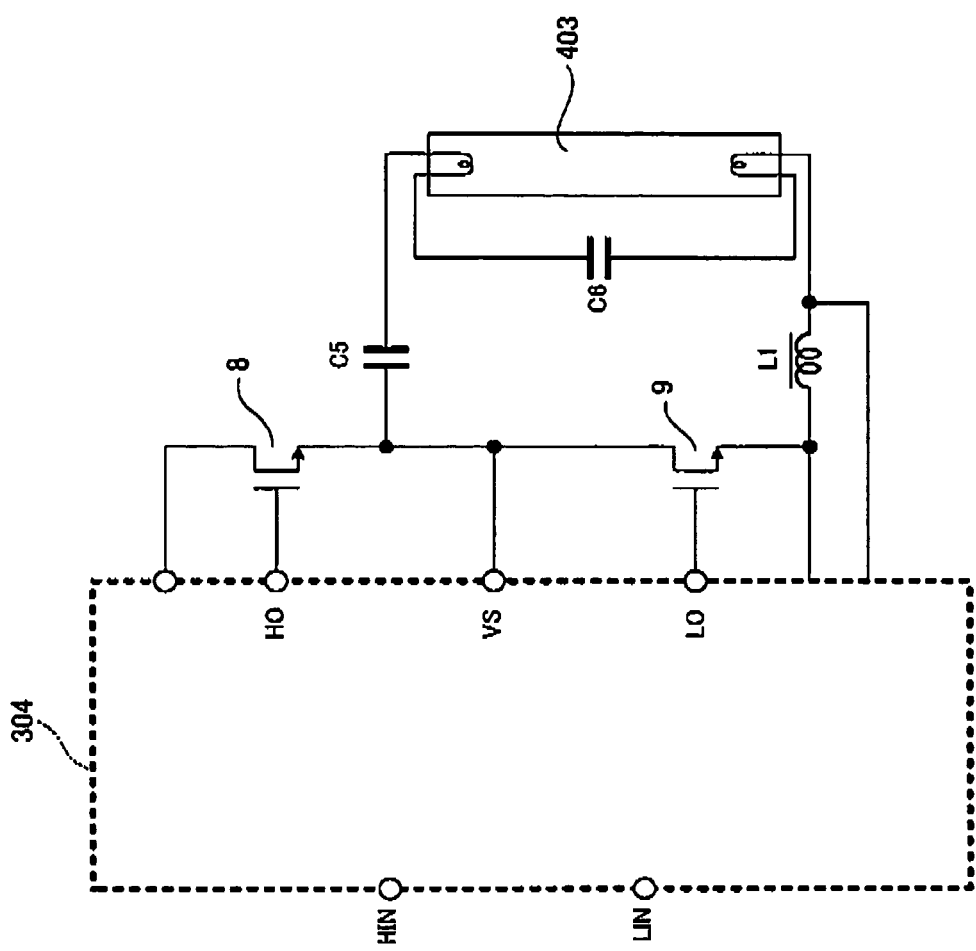
FIG. 21 is a connection diagram of a capacitive load.
Figure 22:
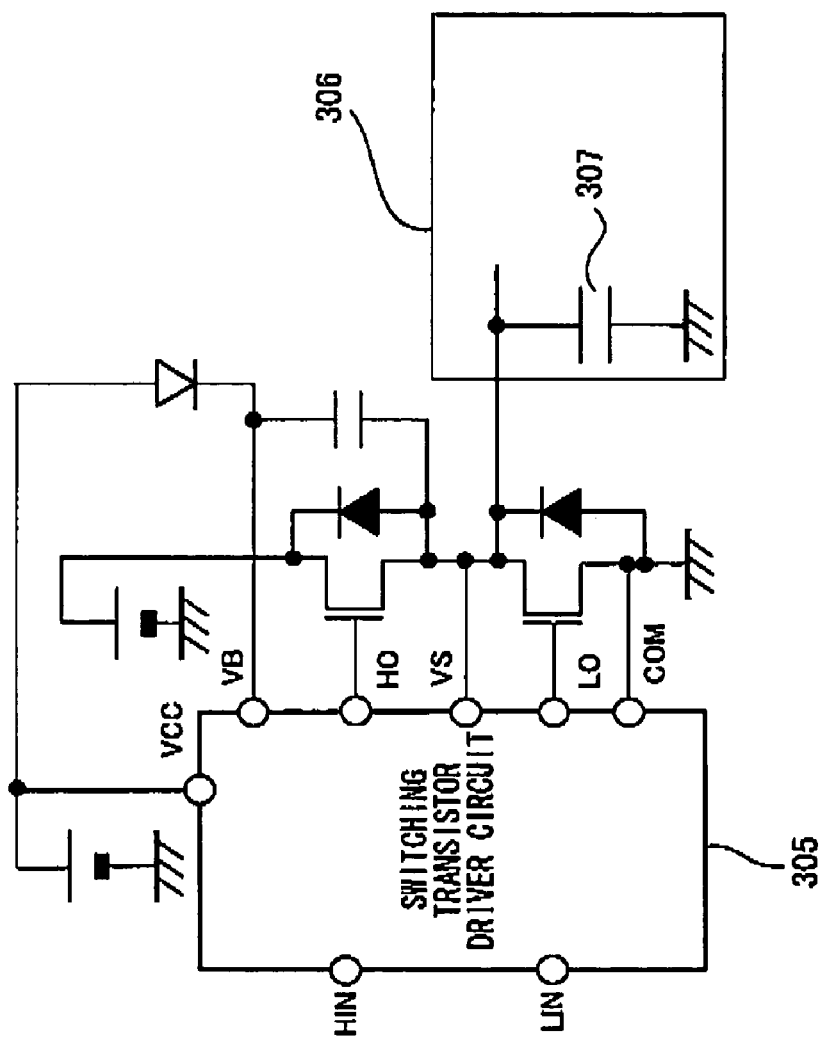
FIG. 22 is a connection diagram of another capacitive load.

FIGS. 20 to 22 show specific examples of the switching transistor driver circuits and the loads 33 of the embodiments. FIG. 20 shows a configuration for applying power to windings L1, L2 and L3 of a three-phase motor used for an air conditioner, an electric washing machine, and so on. In this case, three switching transistor driver circuits 301, 302 and 303 are operated by three signals S1, S2 and S3 outputted from a control unit 300. The foregoing pairs of switching transistors connected in series are respectively connected to the outputs of the switching transistor driver circuits 301, 302 and 303. In a period during which power is applied to the windings L1 and L2 of the three-phase motor, the switching transistor connected to a high side output terminal HO of the switching transistor driver circuit 301 and the switching transistor connected to a low side output terminal LO of the switching transistor driver circuit 302 are turned on to pass current as indicated by a dashed arrow 401. When the switching transistor connected to the high side output terminal HO of the switching transistor driver circuit 301 switches from on to off and the upper and lower switching transistors are both turned off, current passes, as indicated by a solid arrow 402, through a diode of the switching transistor connected to a low side output terminal LO and a lower reference potential input terminal VS of the switching transistor driver circuit 301 has a negative potential. When the switching transistor connected to the low side output terminal LO is turned on after that, current passes through the switching transistor.

FIG. 21 shows a configuration for applying power to a fluorescent tube 403. In this case, the fluorescent tube 403 is connected to a switching transistor driver circuit 304 via a capacitor C5 and an inductance L1. Although this example shows a self excitation type for feedback through the inductance L1, one end of the fluorescent tube 403 may be grounded without the provision of the inductance L1 and signals on the high side output terminal HO and the low side output terminal LO may be generated by separate excitation.

FIG. 22 shows that a switching transistor driver circuit 305 is used as a sustain driver for a plasma display panel. Reference numeral 306 denotes a sustain electrode for the PDP. Reference numeral 307 denotes a capacitance component between the sustain electrode and another electrode or a parasitic capacitance component of the sustain electrode. The sustain electrode 306 may be a panel driver circuit.

The present invention is effective for electrical equipment requiring, when driving a load with a power device, a switching transistor driver circuit for transforming a low-voltage control signal to a high-voltage control signal.

What is claimed is:

1. A switching transistor driver circuit in which a series junction between a high-side switching transistor on a high potential side and a low-side switching transistor on a low potential side is an output terminal, and power supply to the output terminal is controlled, the switching transistor driver circuit comprising:
   a reset dominant latch circuit;
   a high side circuit which is switched based on a first input pulse signal fed to a high side input terminal and generates a control pulse signal for turning on/off the high side switching transistor; and
   a low side circuit which is switched based on a second input pulse signal fed to a low side input terminal and generates a control pulse signal for turning on/off the low side switching transistor,
   wherein the low side circuit comprises:
   a delay circuit which is disposed on a path from the low side input terminal to the low-side switching transistor to make a correction of a signal delay time in the high side circuit and contributes to formation of the control pulse signal for turning on/off the low-side switching transistor; and
   a reset pulse generation circuit for delaying the second input pulse signal fed from the low side input terminal and generating a reset pulse signal for preventing a malfunction for the high side circuit,
   the high side circuit comprises:
   a first edge detection circuit for detecting a leading edge of the first input pulse signal;
   a second edge detection circuit for detecting a trailing edge of the first input pulse signal;

a first level shift circuit for changing a voltage level of a first edge signal outputted from the first edge detection circuit; and a second level shift circuit for changing a voltage level of a second edge signal outputted from the second edge detection circuit, the latch circuit has a minimum reference potential terminal connected to a low potential side of the high-side switching transistor, the latch circuit has a set terminal fed with a signal obtained by changing, in the first level shift circuit, the voltage level of the first edge signal, the latch circuit has a reset terminal fed with signals obtained by changing, in the second level shift circuit, the voltage level of the second edge signal and a voltage level of the reset pulse signal outputted from the reset pulse generation circuit, the high-side switching transistor is driven based on an output signal from the latch circuit, and the latch circuit is reset in one of a period during which a terminal voltage of the output terminal is inverted or a period immediately after the inversion.

2. The switching transistor driver circuit according to claim 1, wherein the latch circuit is reset when the low-side switching transistor is turned on after the high-side switching transistor is turned off or in a period during which current passes through the output terminal from the low-side switching transistor after the high-side switching transistor is turned off.

3. The switching transistor driver circuit according to claim 1, wherein the reset pulse generation circuit generates a reset signal for the latch circuit in synchronization with one of a leading edge or a trailing edge of the second input pulse signal in one of a period during which the terminal voltage of the output terminal is inverted or a period immediately after the inversion.

4. The switching transistor driver circuit according to claim 1, wherein the delay circuit is made up of a first delay circuit fed with the second input pulse signal as an input signal and a second delay circuit fed with the output signal of the first delay circuit as an input signal, the reset pulse generation circuit is fed with an output signal of the first delay circuit as an input signal, and the low-side switching transistor is driven based on an output signal of the second delay circuit.

5. The switching transistor driver circuit according to claim 1, wherein the delay circuit is made up of first and second delay circuits, each being fed with the second input pulse signal as an input signal, the reset pulse generation circuit is fed with an output signal of the first delay circuit having a shorter delay time than the second delay circuit, and the low-side switching transistor is driven based on an output signal of the second delay circuit.

6. The switching transistor driver circuit according to claim 1, further comprising a delay circuit between inputs of the first and second edge detection circuits and the high side input terminal.

7. The switching transistor driver circuit according to claim 1, wherein in one of a period during which the terminal voltage of the output terminal is inverted or a period immediately after the inversion, a generator of a reset signal inputted to the latch circuit sets timing of start of reset in response to the signal from the second edge detection circuit for switching the high-side switching transistor from on to off, the reset is completed in synchronization with one of a leading edge or a trailing edge of the second input pulse signal, a reset pulse width serving as a reset period is set by the output signal of the reset pulse generation circuit, and a continuous reset pulse signal is generated by delaying a rear edge of the output signal of the second edge detection circuit for detecting the trailing edge of the first input pulse signal or advancing a front edge of a reset pulse signal of an output of the reset pulse generation circuit.

8. A switching transistor driver circuit in which a series junction between a high-side switching transistor on a high potential side and a low-side switching transistor on a low potential side is an output terminal, and power supply to the output terminal is controlled, the switching transistor driver circuit comprising:

a reset dominant latch circuit;

a high side circuit which is switched based on a first input pulse signal fed to a high side input terminal and generates a control pulse signal for turning on/off the high side switching transistor; and a low side circuit which is switched based on a second input pulse signal fed to a low side input terminal and generates a control pulse signal for turning on/off the low side switching transistor, wherein the low side circuit comprises a first delay circuit constructed on a path from the low side input terminal to the low-side switching transistor, the high side circuit comprises:

a first edge detection circuit for detecting a leading edge of the first input pulse signal;

a second edge detection circuit for detecting a trailing edge of the first input pulse signal;

a first level shift circuit for changing a voltage level of a first edge signal outputted from the first edge detection circuit;

a second level shift circuit for changing a voltage level of a second edge signal outputted from the second edge detection circuit; and a second delay circuit constructed on an input side of the second level shift circuit, the latch circuit has a minimum reference potential terminal connected to a low potential side of the high-side switching transistor, the latch circuit has a set terminal fed with a signal obtained by changing, in the first level shift circuit, the voltage level of the first edge signal, the latch circuit has a reset terminal fed with a signal obtained by changing, in the second level shift circuit, the voltage level of the second edge signal, the high-side switching transistor is driven based on [[the]] an output signal of the latch circuit, and the latch circuit is reset by delaying the second edge signal from the second edge detection circuit or delaying a rear edge of the second edge signal from the second edge detection circuit, the rear edge indicating timing of end of reset, in one of a period during which the terminal voltage of the output terminal is inverted or a period immediately after the inversion.

9. A switching transistor driver circuit in which a series junction between a high-side switching transistor on a high potential side and a low-side switching transistor on a low potential side is an output terminal and power supply to the output terminal is controlled, the switching transistor driver circuit comprising:

a delay circuit constructed on a path from a low side input terminal to the low-side switching transistor;

a first edge detection circuit for detecting a leading edge of a pulse signal fed to a high side input terminal;

a second edge detection circuit for detecting a trailing edge of the pulse signal fed to the high side input terminal;

a first level shift circuit for changing a voltage level of a first edge signal outputted from the first edge detection circuit;

a second level shift circuit for changing a voltage level of a second edge signal outputted from the second edge detection circuit;

a reset dominant latch circuit; and a gate constructed on an input side of the first level shift circuit, wherein the latch circuit has a minimum reference potential terminal connected to a low potential side of the high-side switching transistor, the latch circuit has a set terminal fed with a signal obtained by changing, in the first level shift circuit, the voltage level of the first edge signal, the latch circuit has a reset terminal fed with a signal obtained by changing, in the second level shift circuit, the voltage level of the second edge signal, the high-side switching transistor is driven based on an output signal of the latch circuit, and in a period during which the high-side switching transistor is turned off by the pulse signal fed to the high side input terminal, a signal for turning on the high-side switching transistor is prohibited by the gate from being inputted to the set terminal of the latch circuit by using one of a first period during which a signal for turning on the low-side switching transistor is supplied from the low side input terminal to the gate and a second period obtained by delaying the first period.

10. A switching transistor driver circuit in which a series junction between a high-side switching transistor on a high potential side and a low-side switching transistor on a low potential side is an output terminal and power supply to the output terminal is controlled, the switching transistor driver circuit comprising:

a delay circuit constructed on a path from a low side input terminal to the low-side switching transistor;

a first edge detection circuit for detecting a leading edge of a pulse signal fed to a high side input terminal;

a second edge detection circuit for detecting a trailing edge of the pulse signal fed to the high side input terminal;

a first level shift circuit for changing a voltage level of a first edge signal outputted from the first edge detection circuit;

a second level shift circuit for changing a voltage level of a second edge signal outputted from the second edge detection circuit;

a reset dominant latch circuit; and a gate constructed on an input path to the low-side switching transistor from an output of the delay circuit, wherein the latch circuit has a minimum reference potential terminal connected to a low potential side of the high-side switching transistor, the latch circuit has a set terminal fed with a signal obtained by changing, in the first level shift circuit, the voltage level of the first edge signal, the latch circuit has a reset terminal fed with a signal obtained by changing, in the second level shift circuit, the voltage level of the second edge signal, the high-side switching transistor is driven based on an output signal of the latch circuit, and in a period during which the low-side switching transistor is turned off by a pulse signal fed to the low side input terminal, a signal for turning on the low-side switching transistor is prohibited by the gate from being inputted to the low-side switching transistor by using one of a third period during which a signal for turning on the high-side switching transistor is supplied from the high side input terminal to the gate or a fourth period obtained by delaying the third period.

* * * * *